United States Patent [19]

Ovshinsky et al.

[11] Patent Number: 4,723,507
[45] Date of Patent: Feb. 9, 1988

[54] ISOLATION PASSAGEWAY INCLUDING ANNULAR REGION

[75] Inventors: Herbert L. Ovshinsky, Oak Park; David A. Gattuso, Pontiac, both of Mich.

[73] Assignee: Energy Conversion Devices, Inc., Troy, Mich.

[21] Appl. No.: 819,435

[22] Filed: Jan. 16, 1986

[51] Int. Cl.⁴ .................. C23C 16/50; C23C 16/54
[52] U.S. Cl. .................. 118/718; 118/50.1; 118/719; 118/723; 118/900
[58] Field of Search ............... 118/718, 719, 900, 733, 118/50.1, 723

[56] References Cited

U.S. PATENT DOCUMENTS

| 2,925,062 | 2/1960 | Schwindt | 118/719 X |
| 2,971,862 | 2/1961 | Baer et al. | 118/719 X |
| 4,601,260 | 7/1986 | Ovshinsky | 118/718 |
| 4,612,206 | 9/1986 | Shimozato et al. | 118/718 |

Primary Examiner—Evan K. Lawrence
Attorney, Agent, or Firm—Marvin S. Siskind; Richard M. Goldman

[57] ABSTRACT

A passageway which includes an annular region, the passageway adapted to isolate the gaseous contents of one of a pair of adjacent, vacuumized environments from the other of the pair while providing for the movement of a substrate therebetween.

21 Claims, 9 Drawing Figures

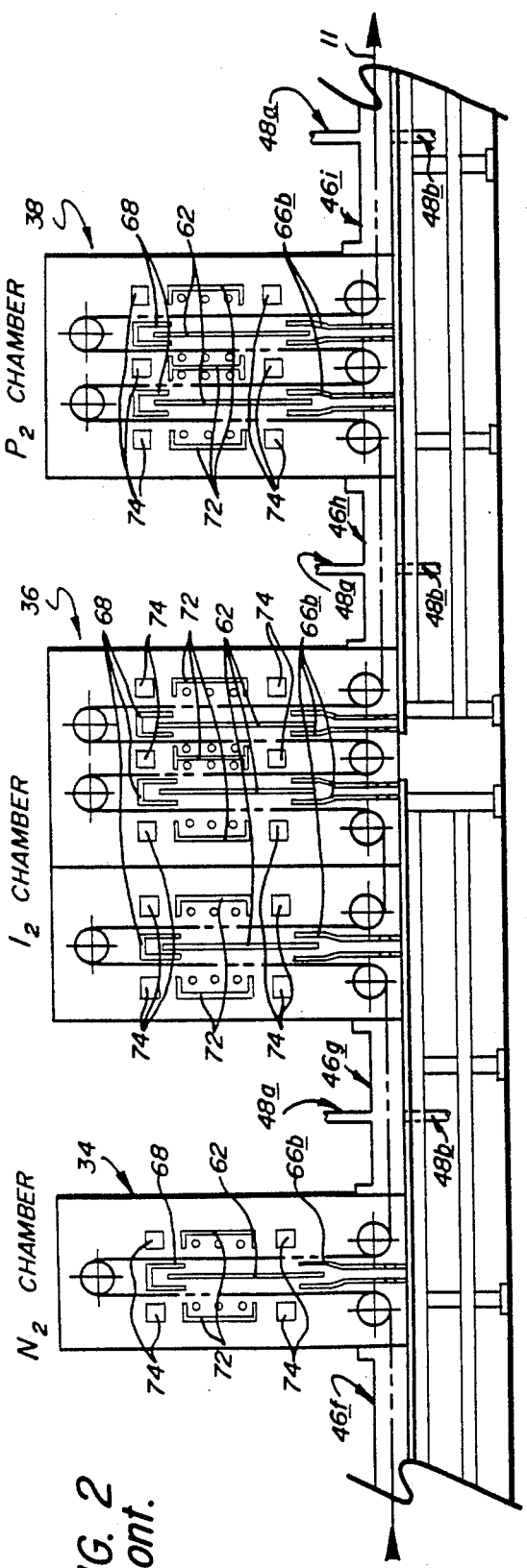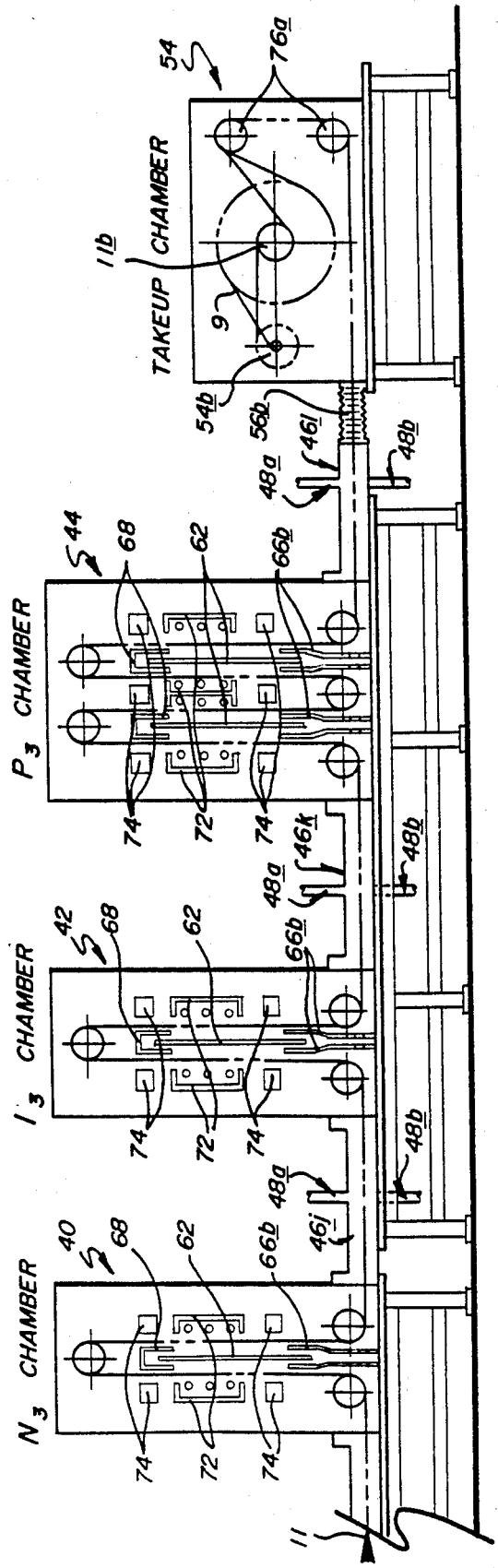
FIG. 2 cont.

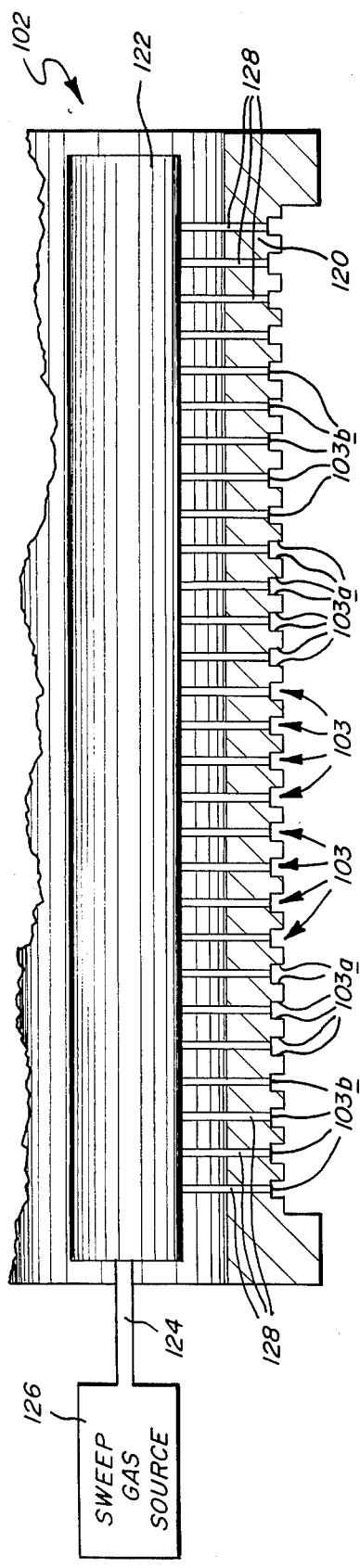
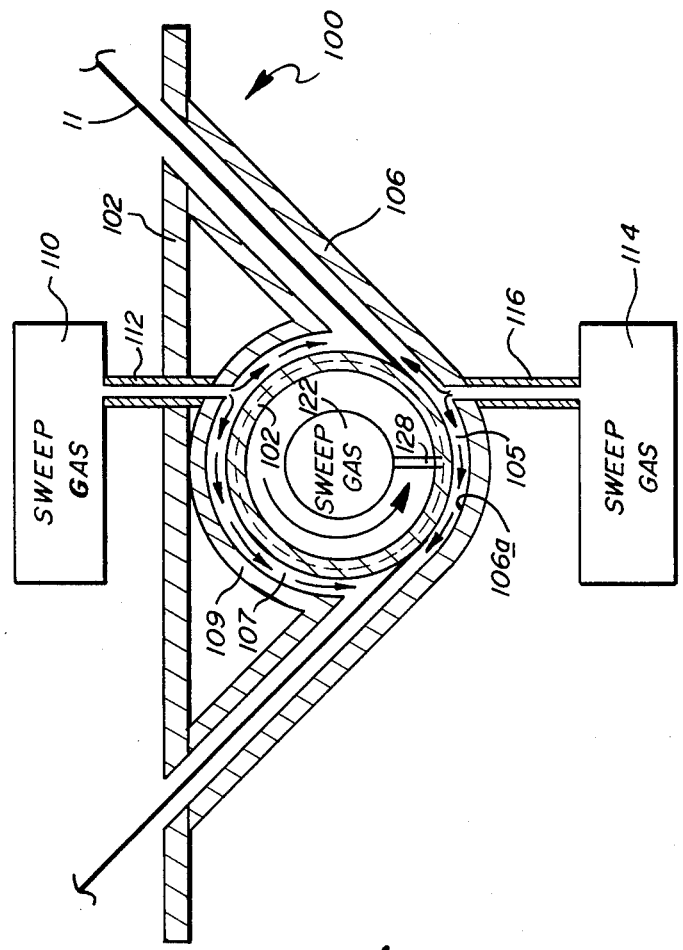
FIG. 5
FIG. 6

ISOLATION PASSAGEWAY INCLUDING ANNULAR REGION

FIELD OF THE INVENTION

This invention relates generally to apparatus adapted to isolate a pair of adjacent environments from one another and more particularly to an improved isolation passageway operatively interconnecting adjacent chambers, at least one chamber of which is adapted to deposit a layer of thin film material in such a manner as to substantially eliminate contamination of the gaseous atmosphere present in one chamber caused by the diffusion of gases from the gaseous atmosphere present in the adjacent chamber.

BACKGROUND OF THE INVENTION

In its most specific embodiment, this invention relates to apparatus specially adapted to produce semiconductor devices on a continuously moving substrate by depositing successive layers of thin film semiconductor alloy material in each of at least two adjacent interconnected deposition chambers. The composition of each layer of said thin film material is dependent upon the particular reaction gas constituents introduced into each of the deposition chambers. While the constituents introduced into the first deposition chamber are carefully controlled and isolated from the constituents introduced into the adjacent deposition chamber, the apparatus must be constructed so as to provide for the continuous passage of said substrate between those chambers. Therefore, the deposition chambers are designed to be operatively interconnected by a relatively narrow passageway (1) through which the substrate may continuously pass and (2) adapted to isolate the reaction gas constituents introduced into the first deposition chamber from the reaction gas constituents introduced into the adjacent deposition chamber.

Applicants' assignee has invented and patented "gas gates" such as those disclosed in U.S. Pat. Nos. 4,438,724 and 4,450,786, which gas gates were operatively designed to prevent dopant gas constituents introduced into a first deposition chamber from diffusing into an adjacent second deposition chamber, thereby contaminating the layer of intrinsic semiconductor alloy material deposited in said second deposition chamber. It is therefore one important feature of the present invention to reduce the size of the isolation passageway of prior art gas gates so as to correspondingly reduce the diffusion of dopant gas constituents present in the dopant gaseous environment from contaminating the intrinsic gas constituents present in the intrinsic gaseous environment.

Another and equally important feature of this disclosure will become apparent from the description presented in the following paragraphs. It is to be noted that the assignee of the subject invention is recognized as the world leader in photovoltaic technology. Photovoltaic devices produced by said assignee have set world records for photoconversion efficiency and long term stablility under operating conditions (the efficiency and stability considerations will be discussed in greater detail hereinbelow). Additionally, said assignee has developed commercial processes for the continuous roll-to-roll manufacture of large area photovoltaic devices. Such continuous processing systems are disclosed in the following U.S. patents, disclosures of which are incorporated herein by reference: No. 4,400,409, for A Method Of Making P-Doped Silicon Films And Devices Made Therefrom; No. 4,410,588, for Continuous Amorphous Solar Cell Production Systems; and No. 4,438,723, for Multiple Chamber Deposition and Isolation System And Method. As disclosed in these patents, a web of substrate material may be continuously advanced through a succession of operatively interconnected, environmentally protected deposition chambers, wherein each chamber is dedicated to the deposition of a specific layer of semiconductor alloy material onto the web or onto a previously deposited layer. In making a photovoltaic device, for instance, of n-i-p type configurations, the first chamber is dedicated to the deposition of a layer of an n-type semiconductor alloy material, the second chamber is dedicated to the deposition of a layer of substantially intrinsic amorphous semiconductor alloy material, and the third chamber is dedicated to the deposition of a layer of a p-type semiconductor alloy material. The layers of semiconductor alloy material thus deposited in the vacuum envelope of the deposition apparatus may be utilized to form photoresponsive devices, such as, but not limited to, photovoltaic devices which include one or more cascaded n-i-p type cells. By making multiple passes through the succession of deposition chambers, or by providing an additional array of deposition chambers, multiple stacked cells of various configurations may be obtained. Note, that as used herein the term "n-i-p type" will refer to any sequence of n and p or n, i and p layers of semiconductor alloy material operatively disposed and successively deposited to form a photoactive region wherein charge carriers are generated by the absorbtion of photons from incident radiation.

The concept of utlizing multiple stacked cells, to enhance photovoltaic device efficiency, was described at least as early as 1955 by E. D. Jackson in U.S. Pat. No. 2,949,498 issued Aug. 16, 1960. The multiple cell structures therein discussed were limited to the utilization of p-n junctions formed by single crystalline semiconductor devices. Essentially the concept espoused by Jackson was to employ different band gap devices to more efficiently collect various portions of the solar spectrum and to increase open circuit voltage (Voc). The tandem cell device (by definition) has two or more cells with the light directed serially through each cell. In the first cell, a large band gap material absorbs only the short wavelength light, while in subsequent cells, smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. Such tandem cell structures can be economically fabricated in large areas by employing thin film semiconductor alloy materials (with or without crystalline inclusions), in accordance with the principles of the instant invention. It should be noted that Jackson employed crystalline semiconductor materials for the fabrication of his stacked cell structure; however, since it is virtually impossible to match lattice contents of differing crystalline materials, it is not possible to fabricate such crystalline tandem cell structures in a commercially feasible manner. In contrast thereto, and as the assignee of the instant invention has shown, such tandem cell structures are not only possible, but can be economically fabricated over large areas by employing the thin film semiconductor alloy materials and the deposition techniques discussed and briefly described herein.

More particularly, the assignee of the instant invention is presently able to manufacture stacked large area photovoltaic devices on a commercial basis by utilizing the previously referenced, continuous deposition, roll-to-roll processor. That processor is characterized by the assignee as a 1.5 megawatt capacity machine insofar as its annual output of photovoltaic devices is capable of producing 1.5 megawatts of electrical power. Said 1.5 megawatt processor, as presently configured, is adapted to produce tandem photovoltaic cells which comprise two stacked n-i-p type photovoltaic devices disposed optically and electrically in series upon a stainless steel web of substrate material. The processor currently includes six operatively interconnected, dedicated deposition chambers, each deposition chamber adapted to sequentially deposit one of the layers of semiconductor alloy material from which the tandem device is fabricated. The deposition chambers vary in length depending upon the thickness of the particular layer of semiconductor alloy material to be deposited therein.

In order to better understand the manner in which the length of the processor is determined, note that the thicknesses of individual layers of semiconductor alloy material vary from approximately 100 angstroms for the doped layers to approximately 3500 angstroms for the lowermost intrinsic layer. Since the processor operates by developing an r.f. plasma which is adapted to decompose the process gases and deposit a layer of semiconductor alloy material and since the thickness of the deposited layer is directly dependent upon the residence time of the web of substrate material in the deposition chamber, the approximately 3500 angstrom thick layer of intrinsic semiconductor alloy material requires a deposition chamber of over six feet in length in order to provide an annual output of 1.5 megawatts of electrical power. The 1.5 megawatt processor also includes additional chambers for (1) the payoff and takeup of the web of substrate material, (2) the cleaning of the web of substrate material and (3) preventing interdiffusion of the gaseous constituents of the adjacent deposition environments, said interdiffusion prevention preferably occurring in the form of discrete isolation passageway chambers (such as external gas gates). With the addition of all of these chambers, the total length of the 1.5 megawatt processor comes to approximately 40 feet. Accordingly, it must be appreciated that, while this 1.5 megawatt processor is the first apparatus capable of commercially fabricating photovoltaic devices; it is a complex, elongated piece of machinery.

The assignee of the instant invention is now designing and constructing a new and improved semiconductor processing machine for the production of significantly higher annual quantities of photovoltaic energy, i.e., about 25 megawatts of electrical power. It must be noted that in order to produce an annual output of 25 megawatts, the length of the machine must be increased so that the length of this 25 megawatt processor will be at least an order of magnitude longer than the present 1.5 megawatt machine. Since not all of the reasons for this increased length are readily apparent, they will be enumerated in the following paragraphs.

A first reason for the elongation is that the new processor will be configured to fabricate tandem photovoltaic devices which comprise at least 3 and possibly 4 stacked cells; therefore the processor will require 9 to 12 dedicated deposition chambers instead of the six dedicated deposition chambers required by the present processor. Another factor in determining the length of the processor, mentioned previously, is that the length of each of the individual deposition chambers is dependent upon the thickness of each of the layers of semiconductor alloy material to be deposited therein. The thickness of that material is, in turn, dependent upon, the rate of deposition of particular mixtures of precursor process gases and the speed of the web of substrate material passing through that chamber of the processor. Consequently, if the rate of deposition of the precursor gas mixture remains constant (and Applicants' assignee finds that significantly increasing the rate of deposition of semiconductor alloy material tends to deleteriously affect the photovoltaic conversion properties of that material), the web speed will also have to be kept constant and the deposition chambers in the 25 megawatt processor will have to be over sixteen times longer than in the 1.5 megawatt processor in order to deposit a sufficient quantity of semiconductor alloy material for fabricating photovoltaic devices which would provide an annual output of 25 megawatts of electrical power.

Even assuming that the presently employed one foot wide web of substrate material was to be increased in size to a two foot width, a scaled-up version of the present processor which is designed to have a 25 megawatt capacity would still total approximately 400 feet in length. Even more significantly, note that in a deposition apparatus of this size, the cathode utilized for the deposition of the thickest layer of semiconductor alloy material, i.e., the bottommost intrinsic layer of semiconductor alloy material of the tandem photovoltaic device, would have to be approximately 60 feet in length.

Clearly, a 400 foot long processor which requires the incorporation of a 60 foot long cathode presents many problems. The physical space required to house a machine approximately the length of 1½ football fields presents problems in plant design, location and cost. Additionally, the mechanical design and operation of such a large, complex machine creates engineering problems related to the maintenance of the required optical, electrical and structural characteristics of the deposited semiconductor alloy material. The length and weight of the 400 foot span of the web of substrate material, which continuously moves through the deposition apparatus, makes web handling and steering difficult, which, in turn, provides for numerous problems in maintaining substrate tracking, alignment and support. Likewise, maintenance of preselected vacuum conditions and deposition parameters within the 400 foot long vacuum envelope which the web of substrate material must traverse is, at best, quite difficult. Similarly, physical maintenance, i.e., disassembly, cleaning, etc. of the deposition apparatus becomes a nightmare.

Even more importantly (because it directly relates to the deposition of uniform, high quality semiconductor alloy material), the large areas covered by some of the deposition cathodes in such a scaled-up 25 megawatt processor creates problems of plasma uniformity and gas utilization within the cathode and deposition regions. Of the foregoing, plasma uniformity poses the most significant problem. Due to the large area plasma regions created by such large area cathodes, nonuniformities in the ionized precursor process gas mixtures are likely to arise. More specifically, varying compositions of the activated process gas mixture along the length of a large area cathode will give rise to irregular and nonhomogeneous plasma sub-regions, which irregularities and nonhomogeneties will result in the deposition of nonuniform, nonhomogeneous layers of semiconductor alloy material.

It should be abundantly clear from the foregoing discussion that, as the 1.5 megawatt continuous photovoltaic device production machine is scaled up to higher throughput capacities, it becomes an economic necessity to substantially reduce the overall length thereof. Such improvements would result in a substantial savings of deposition time, floor space, the cost of building the machine and the operating cost for the production of photovoltaic devices therein.

The Assignee of the instant application has previously disclosed the concept of utilizing a non-horizontally disposed cathode plate in order to simultaneously deposit semiconductor alloy material in discrete plasma regions developed adjacent both of the opposed faces of that cathode plate. This concept is described in U.S. Pat. No. 4,423,701 filed Mar. 29, 1982 entitled "Glow Discharge Deposition Apparatus Including A Non-Horizontally Disposed Cathode", which patent is assigned to the assignee of the instant invention. Prior to the disclosure of said patent, only one-half (one face) of the potential surface area (two faces) of an r.f. powered cathode plate was utilized from which to develop a plasma, thereby limiting to one the number of substrates on which layers of thin film semiconductor alloy material could be simultaneously deposited. The vertical orientation of the cathode plate, as described in said patent provided the further advantage that deposition debris which is generated during the decomposition of the precursor gaseous mixture could not as readily come to rest on the vertically disposed surface of the substrate. Therefore, a continuous processor, utilizing such a generally vertically disposed cathode plate arrangement, would require less down time for dismantling, cleaning and reassembling. Finally, said above-referenced patent recognized the possibility of utilizing two webs of substrate material for the simultaneous and continuous deposition onto each of the webs of successive layers of semiconductor alloy material as said webs moved through the discrete plasma regions, developed on both faces of the cathode plates in each of the deposition chamber (in a generally linear path of travel).

However, while the deposition apparatus generally disclosed in U.S. Pat. No. 4,423,701 described a process of and apparatus for developing a plasma region adjacent each of the opposed faces of a generally vertically disposed cathode plate in order to continuously and simulataneously deposit layers of semiconductor alloy material onto each of two webs of substrate material as those webs passed through a plurality of interconnected deposition chambers, that process still failed to solve the problem of reducing the length of the continuous processor so as to provide a commercially viable deposition process capable of depositing successive layers of semiconductor alloy material for fabricating triple or four (quad) cell tandem photovoltaic devices and having an annual capacity of up to 25 megawatts of electrical power.

Finally, Applicants' assignee, in U.S. Pat. No. 4,601,260 entitled "Vertical Semiconductor Processor", was able to substantially reduce the length of such a 25 megawatt semiconductor processing apparatus by vertically orienting the path of travel of the web of substrate material through the deposition chambers thereof. More particularly, that application is directed to apparatus for the continuous vapor deposition of successive layers of semiconductor alloy material. The apparatus includes a plurality of discrete chambers, each chamber of which is dedicated to the deposition of a layer of semiconductor alloy material of a preselected conductivity type. Pumps are provided for vacuumizing each of the chambers and a web of substrate material is continuously advanced through each of those chambers for the glow discharge deposition of semiconductor alloy material thereonto. The glow discharge structure includes (1) a conduit for introducing a precursor mixture of process gases, (2) a conduit for exhausting nondeposited gases of the precursor mixture and (3) a means for decomposing the precursor mixture in a plasma region. As in the earlier generations of continuous processing machines referred to hereinabove, an isolation chamber is operatively disposed between each of the adjacent discrete deposition chambers for isolating the gaseous environments of adjacent chambers from one another while providing for the passage of the web of substrate material therebetween. The improvement in the apparatus resides in direction of the substrate material through at least one of the deposition chambers in a non-linear path of travel and the operative disposition of the decomposing means so as to develop a plurality of plasma regions in those chambers through which the substrate material is non-linearly directed. In the preferred embodiment, at least two of the plurality of plasma regions are disposed in different non-linear portions of the path of travel through which the substrate material is advanced so that the total length of the deposition apparatus may be substantially foreshortened. In other words, while the web of substrate material must still traverse about 400 feet of real estate in order to have the requisite thickness of semiconductor alloy material deposited thereupon a high percentage of that real estate is traversed in the vertical direction and the aforementioned problems regarding machine length are significantly ameliorated.

In the previously mentioned patent applications, wherein the semiconductor deposition systems are primarily concerned with the production of photovoltaic cells, isolation between the deposition chambers is accomplished either by employing gas gates which pass or "sweep" an inert gas, such as argon or hydrogen, about the substrate as it passes therethrough; by gas gates which establish unidirectional flow of the reaction gas mixture introduced into the intrinsic deposition chamber into the dopant deposition chambers; or by magnetic gas gates which result in a reduced passageway opening between adjacent deposition chambers, said magnetic gates adapted to attract the metallic substrate material moving therethrough so as to reduce the size of the passageway opening and thereby effect a correspondingly decreased amount of "contaminants" diffusing from the dopant deposition chambers into the adjacently disposed intrinsic deposition chamber. It should be noted that any of these gas gates could also be operably connected between non-deposition chambers, as, for example, a chamber in which the transparent conductive oxide layer (discussed hereinafter) is added atop the uppermost layer of semiconductor alloy material. Since it is clearly undesirable to have gaseous constituents from the transparent conductive oxide chamber (or from any chamber in which non-semiconductor gaseous precursors are present) diffuse into the semiconductor deposition chambers, such prior art gas gates were also employed between the transparent conductive oxide chamber and the final chamber in which layers of doped semiconductor alloy material were deposited. In a like manner, any of these types of gas gates could be employed between each and every chamber which is operatively interconnected for continuously producing thin film photovoltaic devices.

While the aforementioned magnetic gas gates proved effective in limiting contamination (relative to similarly constructed but non-magnetic gas gates) by providing for a passageway opening of reduced size through which contaminants could diffuse, the temperature gradients to which the web of substrate material is continually subjected (since deposition parameters require an elevated temperature of approximately 175°-275° C.) tend to warp the web to such a degree that the magnets (which are spacedly positioned throughout the length of the gas gate) are unable to fully flatten the web into a completely planar configuration. Since the web can not be held in a planar configuration, the size of the passageway opening must be designed to provide for sufficient tolerance to prevent contact of a wall of that opening with the deposition surface of the web. The added tolerance means the passageway opening allows for a correspondingly greater degree of diffusion between adjacent chambers than would be necessary if the web could be made to assume a substantially planar configuration while passing therethrough. Further the greater the degree of diffusion a passageway permits, the greater the length of the passageway must be in order to prevent the diffusing gaseous contaminants from one deposition chamber from reaching and entering the adjacent deposition chamber. Therefore, the added tolerance necessitated by the non-planar configuration of the web results in a longer gas gate passageway than would otherwise be necessary and a longer passageway results in a lengthier semiconductor processing apparatus.

It is therefore yet another object of the present invention to provide an isolation passageway which is adapted to maintain the web of substrate material passing therethrough in a substantially planar attitude (relative to the wall of the passageway opening against which it is urged) for decreasing the size of the passageway opening and thereby allowing for a decrease in the length of the passageway due to a decrease in the percentage of contaminants which are permitted entry into that passageway opening.

While previously described patent application Ser. No. 718,571 dealt with the problem of foreshortening the overall length of a semiconductor deposition apparatus while simultaneously increasing the annual electrical output of photovoltaic cells produced therein, no attention was paid to the existing length of the external isolation passageways deployed between every chamber which was adapted to deposit one of the successive layers of semiconductor alloy material. This oversight becomes important when realizing the fact that, and as pointed out hereinabove, the number of discrete layers of semiconductor alloy material which must be deposited in said next generation processor will be increased from six in the present tandem (two cell) configuration to nine in a triple (3 cell) configuration or twelve in a quadruple (4 cell) configuration. For the incorporation of each additional layer of semiconductor alloy material, an additional isolation passageway will also have to be incorporated in order to achieve the requisite degree of isolation between adjacent deposition chambers. Accordingly, it can now be appreciated that a reduction in the length of the isolation passageways would result in a further and appreciable reduction in the total length of the processor. It is therefore another object of the present invention to design an isolation passageway which is foreshortened over the length of previous gas gates so as to achieve a further reduction in the total length of photovoltaic processors which are designed to deposit successive layers of semiconductor alloy material.

One further aspect (of providing isolation through the use of sweep gases) must be touched upon in order to fully appreciate the technology involved. This aspect deals with the degree of isolation which is necessary in order to fabricate a highly efficient photovoltaic device. More particularly, it must be realized just how seriously and deleteriously "contaminants" can affect the efficiency of the semiconductor device produced in the vacuum envelope of the semiconductor processor. For instance, if a gas gate passageway is dimensioned to be approximately 0.4 inches high, 16 inches wide and 6 inches long with the pressure in a first chamber being 0.6 torr and the pressure in an adjacent second chamber being 0.57 torr, a flow rate of 500 SCCM of the precursor gaseous constituents passing through the gas gate passageway interconnecting those chambers will result in the presence of sufficient gaseous precursor constituents to sustain the plasma in the deposition chambers as well as to provide a concentration ratio of the dopant species from the first deposition chamber to the intrinsic species present in the adjacent second deposition chamber of about $10^4$. This ratio represents a concentration approximately sufficient to produce an intrinsic thin film semiconductor alloy material in the second deposition chamber of high purity. It must be understood that the flow rates, slot dimensions, and chamber pressure stated hereinabove represent but one example of parameters which are sufficient for the practice of the present invention. Other flow rates, slot dimensions and chamber pressures may also be utilized for providing effective isolation of the intrinsic semiconductor alloy material deposited in one of the chambers from the dopant semiconductor alloy material deposited in the adjacent deposition chamber.

It is further to be noted that Applicants' gas gates, discussed hereinabove, are effective in maintaining at least a $10^4$ concentration ratio of the element absent in the intrinsic deposition chamber relative to the element present in the dopant deposition chamber by establishing a substantially viscous flow of gases through the gas gate slot. It must be noted that gases moving within the deposition system of the subject application, which system is maintained at a pressure of approximately $5 \times 10^{-1}$ torr and above, are in the viscous flow regime, whereas gases moving through a deposition system which is maintained at a pressure of approximately $5 \times 10^{-2}$ to $5 \times 10^{-3}$ torr are in a transition flow regime known as the Knudsen flow regime, and gases moving through a deposition system which is maintained at a pressure of approximately $5 \times 10^{-3}$ torr and below are in the molecular flow regime.

In a molecular flow regime, a flow of gases in a first direction cannot limit the back diffusion of gases. This is because, at the pressure which gives rise to molecular flow, the molecules of the oppositely directed process and sweep gases are so widely separated that relatively few diffusion limiting collisions can occur therebetween. Applicants' glow discharge deposition system, since it operates at approximately 0.5 torr, clearly operates in the viscous flow regime. It is in this viscous flow regime that, the molecules of oppositely directed process and sweep gases realize a sufficient number of intermolecular collisions so as to effectively limit back diffusion from one of the pair of chambers to the adjacent chamber.

It should thus be realized that Applicants' improved isolation passageway, as described hereinafter, while particularly adapted for use in systems operating at below atmospheric pressures, it is effective only in pressure regimes which give rise to the viscous flow of gases. It is therefore only in these viscous pressure regimes that the isolation passageway of the subject invention is operable to limit contamination in the aforedescribed $10^4$ contamination level.

While the magnetic gas gates disclosed apparatus (namely ceramic magnets positioned above the gas gate passageway opening for urging the magnetic substrate upwardly) by which the height dimension of the passageway opening in the gas gate could be reduced (the reduction in the height dimension of the passageway opening correspondingly reducing the diffusion of dopant gases for a given flow rate, thereby decreasing the contamination of the process gases introduced into and, consequently, the layer of semiconductor alloy material deposited in the intrinsic deposition chamber), Applicant's assignee has reported in U.S. Pat. No. 4,450,786 entitled "Grooved Gas Gate", the disclosure of which is incorporated by reference, that when the web of substrate material is urged by the magnets against the upper wall of the gas gate passageway, the passageway is divided by the web of substrate material into a relatively wide lower slit and a realtively narrow upper slit. For purposes of the instant application the term "upper slit" shall be defined as the spacing, however irregular it may be, between the upper surface of the substrate and the upper wall of the gas gate passageway. Irregular spacing between the web and the upper passageway wall may be present because waffling of the web of substrate material cannot be completely liminated by the attractive force of the magnets. The process gases, being inherently viscous, are unable to travel through the narrow upper slit with sufficient velocity to prevent the diffusion of process gases from the dopant deposition chamber into the adjacent intrinsic deposition chamber.

More particularly, note that gas may be introduced into the passageway opening to "sweep" diffusing contaminants back into the dopant deposition chambers. In order to effect this "sweep", it is required that the velocity of the inert sweep gases and residual process gases traveling through the passageway opening be selected to be sufficiently great to substantially prevent the back diffusion of process gases from the dopant deposition chamber to the intrinsic chamber. However, and as detailed in said '786 patent, due to the fact that the sweep gases employed in the gas gates are viscous, which viscosity becomes more pronounced at the elevated temperatures required for the glow discharge deposition of thin film layers of semiconductor alloy material onto the substrate, the drag on the sweep gases along (1) the upper passageway wall and (2) the unlayered surface of the substrate, which define the relatively narrow upper slit, results in a relatively low velocity flow therethrough. Accordingly, an undesirably high amount of dopant process gas is able to diffuse into the intrinsic deposition chamber through that narrow upper slit.

The velocity profile of the sweep gases flowing from the intrinsic deposition chamber to the dopant deposition chamber through the relatively wide lower passageway slit may be depicted by a generally parabolically shaped curve in which the velocity of the sweep gases is greatest at the center of the slit and at a minimum along the walls thereof. The velocity profile of the sweep gases flowing from the intrinsic deposition chamber to the dopant deposition chamber through the relatively narrow upper passageway slit may also be depicted by a generally parabolically shaped curve, similar to the curve for the wide passageway slit. However, a comparison of the two velocity profiles reveals that the velocity of the sweep gases flowing through the lower, relatively large passageway slit is far greater than the velocity of the sweep gases flowing through the upper, relatively narrow passageway slit. Further, since the height dimension of the narrow upper slit is permitted to vary with the random warping and canoeing of the relatively thin substrate material, the degree of contamination due to back diffusion of dopant process gases is able to correspondingly fluctuate.

At this point, and in order to better understand the relationship of the counter flow of sweep gas to the diffusion of process gas between adjacent deposition environments, it is necessary to discuss the pressure differential which is developed between the adjacent deposition chambers operatively connected by a gas gate. If one was to plot the number of atoms of a gas per second flowing through the narrow passageway opening as a function of the size of that opening (assuming a constant pressure differential is maintained on both ends of the opening) it would be apparent that as the size of the passageway opening is increased, the volume of gases flowing therethrough in order to maintain the constant pressure differential must correspondingly increase. This represents a desirable gas gate characteristic because the greater the velocity of sweep gas flowing from the intrinsic deposition chamber to the dopant deposition chamber, the more difficult it becomes for dopant gases to diffuse against the counter and prevailing flow from the dopant deposition chamber to the intrinsic chamber. The functional dependency of back diffusion, relative to the size of the gas gate passageway opening is represented by the equation (a) $(e^{-a^2})$ where "a" represents the passageway opening. That functional dependency, as evidenced by the amount of back diffusion, reaches a maximum when "a" is about 200 microns or about 10 mils. It is therefore essential that both, the size of the slit above, as well as below, the web of substrate material be kept at or above the 200 micron level at which gas flow is maximized. Through the application of the principles of the subject invention, there is no problem in creating a sufficiently large opening below the web of substrate material since the substrate material is urged under tension against the upper cylindrically-shaped wall of the passageway opening.

However, it is further necessary to prevent the back diffusion of dopant gases through the narrow opening above the web of substrate material (in those instances in which tension on the web is relaxed and dopant gases "seep" into the narrow upper slot) by providing a plurality of circumferential grooves about the surface of the cylindrical drum of the isolation passageway. In this manner, a plurality of spaced, relatively high velocity flow channels are provided in the space defined between the unlayered surface of the web of substrate material and the upper cylindrical wall of the passageway opening. Because the channels are relatively deep, the sweep gases and residual process gases are adapted to flow therethrough at substantial velocities despite the drag incurred as said gases contact the oppositely disposed passageway wall and the substrate surface. Although relatively narrow slits still exist between adjacent high velocity flow channels established by the elongated grooves, it is much more probable for molecules of dopant process gases to enter the high velocity channels during their traverse of the passageway opening separating the dopant deposition chamber from the intrinsic deposition chamber, than to have those molecules remain in the narrow slit between the high velocity flow channels for the entire length of that migration. In order to further insure that back diffusion is prevented, additional sweep gas may be introduced into each of the high velocity flow channels at a point intermediate the length of the gas gate passageway opening. Because of the velocity which the sweep gas can attain in each of the "roomy" flow channels and because of intermolecular collisions which occur between the dopant gases and the sweep gas in the viscous flow regime present in the isolation passageway, the amount of back diffusion from the dopant deposition chamber to the intrinsic deposition chamber is substantially reduced and the production of a more efficient photovoltaic device may be accomplished.

These and the many other objects and advantages of the present invention will become clear from the drawings, the detailed description of the invention and the claims which follow hereinafter.

BRIEF SUMMARY OF THE INVENTION

There is disclosed herein an isolation passageway for substantially preventing the diffusion of gases from one of a pair of adjacent vacuumized environments into the other of said pair of vacuumized environments. The first environment differs from the second by the presence of at least one elemental contaminant. The improved isolation passageway is (1) defined by closely spaced walls, (2) adapted to provide for the movement of a substrate therethrough, (3) substantially annular in a central cross-sectional region and rectangular in the two regions adjacent thereto, said cross-section taken in a plane extending in the direction of the path of the substrate and (4) adapted to maintain at least a $10^4$ ratio of the concentration of the at least one element in said first environment as compared to the concentration in said second environment. By further urging one surface of the substrate traveling through the passageway into contact with one of the passageway walls, an isolation passageway of reduced height and length dimensions is provided which is adapted to both decrease the diffusion of gases between said chambers and decrease the length of the passageway so as to correspondingly decrease the length of the deposition machine in which said passageway is incorporated.

The passageway wall which contacts the unlayered surface of the substrate is fabricated from a low friction, low thermal conductivity material such as borosilicate glass. The substrate may be formed from a magnetically attractable material and the substrate may be urged into contact with the glass through magnetic attraction. In a preferred embodiment, each of the adjacent environments are developed and maintained in a dedicated chamber, each chamber adapted to deposit thin film layers of semiconductor alloy material. The chambers are vacuumized to a pressure of about 0.25 to 1 torr. In the most preferred embodiment, the nonlayered surface of the substrate is urged into contact with the passageway wall through the use of roller means which place said nonlayered substrate surface under tension against a passageway wall.

Also in the most preferred embodiment, (1) the passageway is annular in a central cross-sectional region, one boundary of the annular cross-sectional configuration of the passageway formed by a cylindrical drum, the cross-section taken in a plane extending in the direction of the path of the substrate, and (2) the substrate is an elongated web and the nonlayered surface of the web is urged against the circumferential surface of the drum. A plurality of circumferential grooves are spacedly positioned across the entire longitudinal extent of the cylindrical drum for accepting and guiding sweep gas into a first series of flow channels formed between the grooves and the substrate web. The grooves are adapted to sustain a flow of sweep gas at a velocity sufficient to substantially prevent the diffusion of process gas from the first to the second chamber through said first channels.

Sweep gas is also introduced into a second flow channel formed between the substrate web and the surface of the passageway opposite the surface against which said web is urged. The flow of sweep gas through the passageway in the second channel is at a velocity sufficient to substantially prevent the diffusion of process gas from the first to the second chamber. The passageway may further include structure for subjecting the surface of the substrate not urged into contact with the passageway wall to a plasma as said substrate moves through said passageway. The plasma is preferably a hydrogen plasma which is useful in capping the surface of the previously deposited layer of semiconductor alloy material. The first environment is preferably a first chamber adapted for the deposition of a first layer of semiconductor alloy material and the second environment is a second chamber adapted for the deposition of a second layer of semiconductor alloy material differing in conductivity type from the conductivity type of the first layer. Both the semiconductor alloy material and the hydrogen plasma may be accomplished by either r.f. or microwave energy systems.

BRIEF DESCRIPTION OF THE DRAWINGS

FIG. 5 is a fragmentary cross-sectional view taken along line 5—5 of the FIG. 3 isolation passageway of the instant invention and illustrating an embodiment thereof in which peripheral grooves are spacedly positioned about the cylindrical drum of the passageway;

FIG. 6 is a partial cross-sectional view taken in a plane extending in the direction of the path of the substrate and depicting an embodiment of the isolation passageway of the instant invention in which gas is swept between the passageway wall and the substrate for preventing the back diffusion of gaseous reactants between adjacent deposition chambers;

DETAILED DESCRIPTION OF THE DRAWINGS

I. The Photovoltaic Cell

Figure 1:
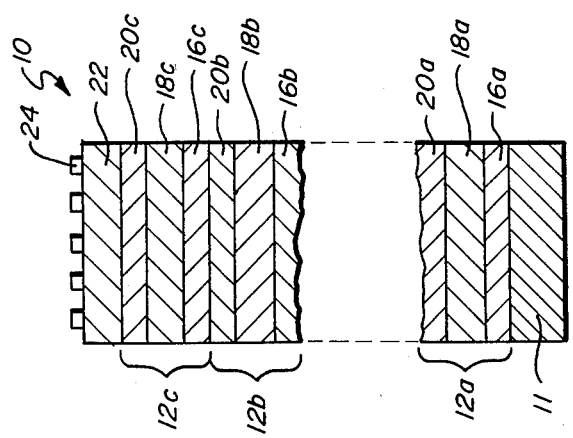
FIG. 1 is a fragmentary, cross-sectional view of a tandem photovoltaic device, said device comprising a plurality of n-i-p type cells, each layer of the cells formed from a thin film semiconductor alloy material.

Referring now to the drawings and particularly to FIG. 1, a photovoltaic cell, formed of a plurality of successive n-i-p layers, each of which is formed from, preferably, a thin film semiconductor alloy material as shown generally by the reference numeral 10.

More particularly, FIG. 1 shows a p-i-n type photovoltaic device such as a solar cell made up of individual p-i-n type cells 12a, 12b and 12c. Below the lowermost cell 12a is a substrate 11 which may be transparent or formed from a metallic material such as stainless steel, aluminum, tantalum, molybdenum, chrome, or metallic particles embedded within an insulator. Although certain applications may require a thin oxide layer and/or a series of base contacts prior to the application of the amorphous material, for purposes of this application, the term "substrate" shall include not only a flexible film, but also any elements added thereto by preliminary processing. Also included within the scope of the present invention are substrates formed of synthetic polymers, glass or a glass-like material on which an electrically conductive electrode is applied.

Each of the cells 12a, 12b and 12c are preferably fabricated with a thin film semiconductor body containing at least a silicon alloy. Each of the semiconductor bodies includes a p-type conductivity semiconductor layer 20a, 20b and 20c; a substantially intrinsic semiconductor layer 18a, 18b and 18c and an n-type conductivity semiconductor layer 16a, 16b and 16c. Note that the intrinsic layer may include traces of n-type or p-type dopant material without forfeiting its characteristic neutrality, hence it may be referred to herein as a "substantially intrinsic layer". As illustrated, cell 12b is an intermediate cell and, as indicated in FIG. 1, additional intermediate cells may be stacked atop the illustrated cells without departing from the spirit or scope of the present invention. Also, although n-i-p photovoltaic cells are illustrated, the methods and materials described herein may also be and are preferably utilized to produce single or multiple p-i-n cells, accordingly, the term "n-i-p type" as used herein is meant to include any aggregation of n, i and p layers operatively disposed to provide a photoactive region for generating charge carriers in response to the absorption of photon energy. Additionally, the disclosed deposition apparatus may be readily adapted to produce p-n cells, Schottky barrier cells, as well as other semiconductor or devices such as diodes, memory arrays, photoconductive devices and the like.

It is to be understood that following the deposition of the semiconductor alloy layers, a further deposition process may be either performed in a separate environment or as a part of a continuous process. In this step, a TCO (transparent conductive oxide) layer 22, preferably formed of indium tin oxide, is added. An electrode grid 24 may be added to the device where the cell is of a sufficiently large area, or if the conductivity of the TCO layer 22 is insufficient. The grid 24 is adapted to shorten the carrier path and increase the conductive efficiency.

II. The Multiple Chamber Apparatus

Figure 2:
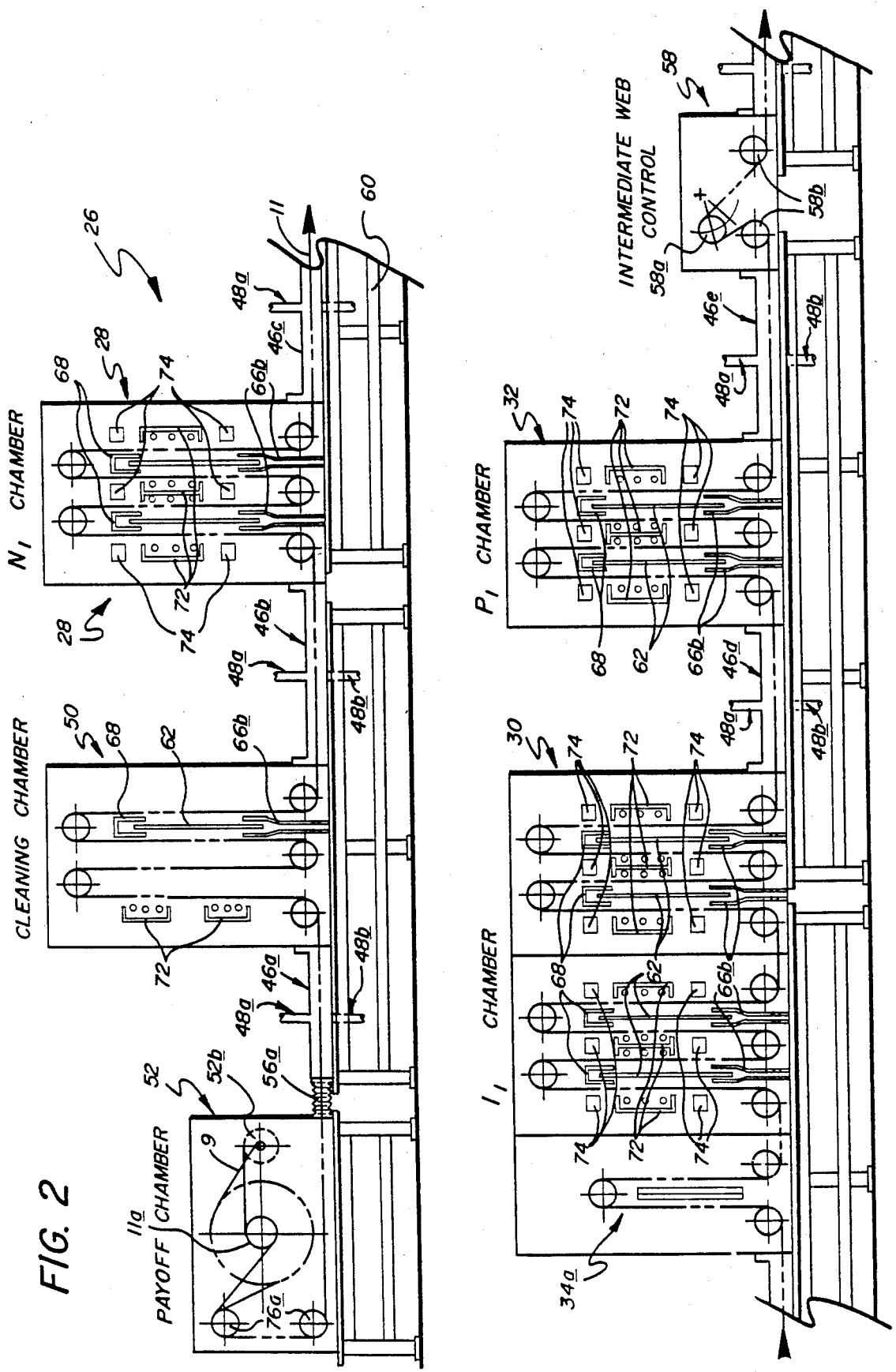
FIG. 2 is a schematic depiction of a vertically oriented apparatus adapted to continuously deposit a plurality of successive, thin film layers of semiconductor alloy material upon a continuously advancing web of substrate material.

Turning now to FIG. 2, a generally diagrammatic representation of the multi-chambered glow discharge deposition processor for the continuous production of tandem or cascade-type photovoltaic cells is illustrated generally by the reference numeral 26. Due to the elongated nature of the processor 26 (the illustrated processor has a 25 megawatt capacity and is about 140 feet in length), it has been necessary to cut away and continue the longitudinal extent thereof in a plurality of rows across the sheets of drawings. However, and as should be readily apparent, in actual construction and operation, the processor 26 is preferably aligned so that each of the deposition chambers thereof is arranged in a generally linear arrangement. The processor 26 includes a plurality of isolated and dedicated deposition chambers. The term "dedicated" as used herein, will mean the precursor gaseous mixtures of each adjacent deposition chamber are substantially prevented from cross contaminating one another. Moreover, each deposition chamber has introduced thereinto a particular precursor gaseous mixture of process gases which is protected by an external isolation passageway module from (1) contaminating the precursor gaseous mixture introduced into adjacent deposition chambers and (2) being contaminated by environmental conditions.

The processor 26 is particularly adapted to deposit a high volume of large area amorphous triple tandem photovoltaic cells having a generally n-i-p-type configuration onto the deposition surface of the web of substrate material 11 which is continually fed therethrough. In order to deposit the semiconductor alloy material required for producing a tandem photovoltaic device of such an n-i-p-type configuration, the processor 26 includes: a first deposition chamber 28 in which an n-type conductivity layer of semiconductor alloy material is deposited onto the deposition surface of the web of substrate material 11 as said web passes therethrough; a second deposition chamber 30 in which a layer of substantially intrinsic semiconductor alloy material is deposited atop the layer of n-type semiconductor alloy material on the deposition surface of the web of substrate material 11 as the web 11 passes therethrough; a third deposition chamber 32 in which a layer of p-type conductivity semiconductor alloy material is deposited atop the layer of intrinsic semiconductor alloy material on the deposition surface of the web of substrate material 11 as the web passes therethrough; a fourth deposition chamber 34 in which a second n-type conductivity layer of semiconductor alloy material is deposited atop the layer of p-type semiconductor alloy material on the deposition surface on the web of substrate material as the web 11 passes therethrough; a fifth deposition chamber 36 in which a second layer of intrinsic amorphous semiconductor alloy material is deposited atop the second layer of p-type semiconductor alloy material on the deposition surface on the web of substrate material 11 as the web 11 passes therethrough; a sixth deposition chamber 38 in which a second layer of p-type conductivity semiconductor alloy material is deposited atop the second layer of intrinsic semiconductor alloy material on the deposition surface of the web of substrate material 11 as the web 11 passes therethrough; a seventh deposition chamber 40 in which a third layer of n-type conductivity semiconductor alloy material is deposited atop the second layer of n-type semiconductor alloy material on the deposition surface of the web of substrate material 11 as the web 11 passes therethrough; an eighth deposition chamber 42 in which a third layer of intrinsic semiconductor alloy material is deposited atop the third layer of n-type semiconductor alloy material on the deposition surface of the web of substrate material 11 as the web 11 passes therethrough; and a ninth deposition chamber 44 in which a third layer of p-type conductivity semiconductor alloy material is deposited atop the third layer of intrinsic semiconductor alloy material on the deposition surface of the web of substrate material 11 as the web 11 passes therethrough.

It should be apparent that, although nine discrete deposition chambers (three triads of the three deposition chambers) have been described, additional triad deposition chambers or individual deposition chambers may be added to the processor 26 to provide the machine with the capability of producing any number of tandem photovoltaic cells having p-i-n-type or n-i-p-type or p-n-type or n-p-type configuration. It should further be understood that, although, in the preferred embodiment, the substrate is formed as a continuous, electrically conductive web of substrate material 11, the concept of the present invention is equally adapted for depositing the successive layers of semiconductor alloy material atop a continuous, electrically non-conductive substrate or atop discrete, electrically conductive or non-conductive substrate plates which are continuously fed through the plurality of deposition chambers thereof. It should also be apparent that since the length of the path of travel of the web of substrate material 11 through the individual deposition chambers is proportional to the thickness of the n-type, or the intrinsic, or the p-type layer of semiconductor alloy material to be deposited in any one of the given chambers, the length of the path of travel of the web of substrate material 11 through an individual deposition chamber must be increased (if the speed of the web of substrate material 11 is kept constant) in order to deposit a thicker layer thereupon. This can best be illustrated with reference to the first triad of deposition chambers in which the path of travel of the web 11 through the multiple plasma regions developed within the intrinsic deposition chamber 30 can be seen to be much longer than the path of travel thereof through the plasma regions developed within either of the doped deposition chambers 28 and 32 because the intrinsic deposition chamber 30 is adapted for the deposition of a 3500 angstrom thick layer of intrinsic semiconductor alloy material while the doped deposition chambers 28 and 32 are adapted to only deposit layers of approximately 100 angstrom thick semiconductor alloy material.

Still referring to FIG. 2, the processor 26 further includes a plurality of external isolation modules 46a–46l for isolating the particular precursor gaseous mixture introduced into a particular deposition chamber from the mixtures introduced into adjacent chambers, each of said mixtures being operative to deposit a particular layer of semiconductor alloy material of a preselected conductivity type. The isolation modules 46a–46l are preferably disposed externally of the deposition chambers and are adapted to permit the web of substrate material 11 to travel between the discrete deposition chambers which they interconnect while substantially preventing said inter-diffusion of said precursor gaseous mixture from one of a pair of adjacent chambers into the other of the pair. External isolation modules of this type are fully disclosed in U.S. Pat. No. 4,480,585 entitled "External Isolation Module", filed June 23, 1983, the disclosure of which is incorporated herewith by reference and the assignee of which is the same as the assignee of the present invention. Generally, the isolation modules 46a–46l are schematically illustrated as including a pair of elongated, horizontally-disposed, passageway-forming plates, said plates adapted to be spacedly positioned in substantially parallel planes for defining the passageway therebetween. The web of substrate material 11 passing through the passageway divides the passageway into a pair of flow channels, i.e., an upper relatively narrow and a lower, relatively wide channel. Sweep gas is uniformly introduced into each of the channels to prevent the diffusion of the precursor gaseous mixtures between the adjacent deposition chambers.

Positioned on the side of the first deposition chamber 28 opposite the second deposition chamber 30, and in operative interconnection therewith, is a substrate cleaning chamber 50 in which the web of substrate material continuously moving therethrough is subjected to high temperature (on the order of 450° C.) so as to bake out contaminants therefrom. A substrate cleaning plasma may also be developed within that chamber if it is deemed necessary to further rid the web of substrate material 11 of contaminants.

On the side of the cleaning chamber 50 opposite the first deposition chamber 30 is the substrate pay-off chamber 52 from which a roll of substrate material 11 is supplied, under tension, from a pay-off roll 11a to the deposition chambers of the processor 26. As the web 11 is unwound from the roll 11a, a sheet of protective interleaf sheeting 9 is wound about interleaf take-up roller 52b. Also present in the pay-off chamber 52 are a pair of idler turning rollers 76a for initially directing the web 11 in a generally horizontal path of travel through the processor 26.

Positioned on the side of the ninth deposition chamber 44 opposite the eighth deposition chamber 42 is a post deposition take-up chamber 54 in which the web of substrate material 11, with the layers of semiconductor alloy material deposited thereupon, is wound about a take-up core 11b. As the web 11 is wound about the take-up roll 11b, a sheet of protective interleaf sheeting 9 from an interleaf pay-off roller 54b is would therebout. Also present in the take-off chamber 54 are a pair of idler turning rollers 76 for directing the web 11 from its normally horizontal path of travel into winding engagement with the take-up roll 11b.

The first and last external isolation modules 46a and 46l both include a bellows section 56a and 56b, respectively, which bellows are adapted to compensate for expansion or contraction which occurs during operation of the processor 26. Intermediate at least the third deposition chamber 32 of the first triad and the first deposition chamber 34 of the second triad is an intermediate web controller chamber 58 in which a spring tensioning roller 58a is adapted to cooperate with a pair of turning rollers 58b for maintaining the proper tension on the web of substrate material 11. Although only one controller chamber 58 is depicted, it should be apparent that additional controller chambers may be added at any point along the path of travel of the web of substrate material 11 without departing from the spirit or scope of the instant invention. It is also to be noted that each of the deposition chambers, external isolation modules and pay-off and take-up chambers are raised off of the floor and supported by a heavy-duty scaffolding generally depicted by the reference numeral 60. By raising the processor 26 from the floor, said processor is not as responsive to changes in environmental conditions such as heat or cold.

Figure 4:
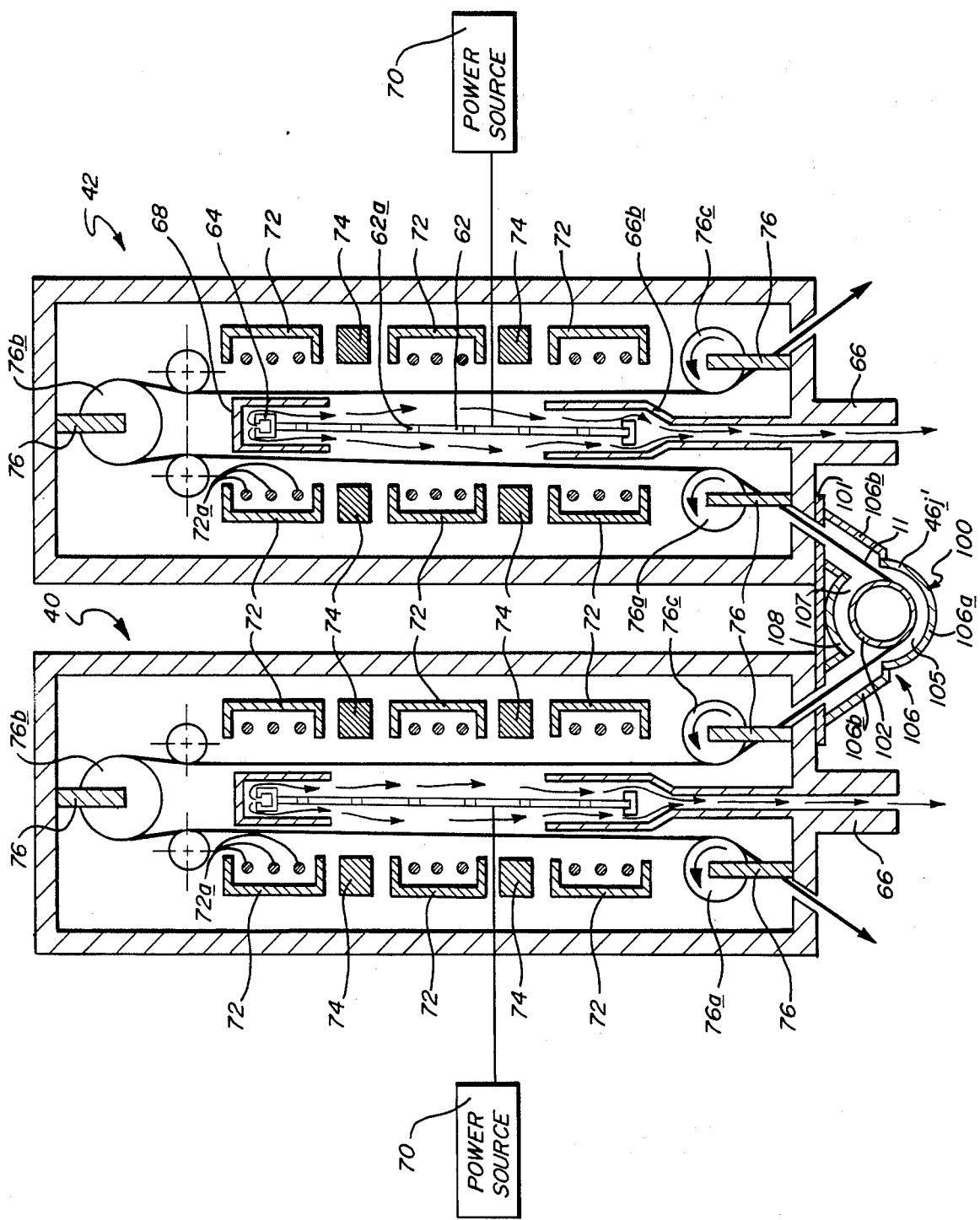
FIG. 4 is a cross-sectional view of the interior configuration of two randomly selected deposition chambers depicted in FIG. 2 as operatively interconnected by the improved isolation passageways of the instant invention and as depicted in FIG. 3.

Referring now to FIG. 4, there is illustrated the interior configuration of two of the deposition chambers, such as the deposition chambers 40 and 42 in which the third layer of n-type semiconductor alloy material and the third layer of intrinsic semiconductor alloy material, respectively, are to be deposited and through which the web of substrate material 11 is adapted to move in a non-linear path of travel. It is to be understood that the deposition chambers 40 and 42 are merely intended to be representative of any of the deposition chambers of the processor 26 and that the third n-type and intrinsic deposition chambers have been selected for purposes of illustration only since those deposition chambers require the web of substrate material 11 to make only one non-linear pass for the deposition thereonto of the third n-type layer and the third intrinsic layer of semiconductor alloy material. An explanation of the operation of any of the other deposition chambers of the processor 26, such as the first intrinsic deposition chamber 30 in which the web of substrate material 11 is adapted to make multiple non-linear passes, may be easily understood from the explanation of the operation of the deposition chamber 40 which follows.

Chambers 40 and 42 are discrete one of the plurality of isolated dedicated deposition chambers operatively interconnected by external isolation modules, such as 46i. Such an external isolation module is also operatively disposed, in the preferred embodiment, between any of the chambers of the processor 26 which are not adapted to deposit semiconductor alloy material, but which cannot be allowed to contaminate the deposition chambers adjacent thereto. Note that the reference numeral 46i' is employed because the external isolation module depicted in FIG. 4 is of the type disclosed in detail hereinafter as the novel isolation passageway of the instant invention.

The deposition chambers 40 and 42 include a cathode plate 62 having a plurality of apertures formed therethrough so as to perforate same for the uniform mixing of process gases introduced into one side of the plate with the process gases introduced onto the other side of the cathode plate 62; an upper, transversely elongated generally U-shaped cathode shield 68 which is adapted to restrict the precursor gaseous mixture entering the cathode region from a elongated apertured introductory manifold 64 from exiting the plasma region; and a lower transversely elongated cathode shield 66b which is adapted to prevent the non-deposited precursor gaseous mixture from leaving the cathode region after said mixture has passed through the plasma region developed between the web 11 and both of the faces of the cathode plate 62. The lower cathode shield 66b includes a conically-shaped portion which is operatively interconnected with the exhaust conduit 66 from which the non-deposited precursor gaseous mixture is exhausted from the deposition chamber 40. The lower cathode shield 66b further includes a plurality of apertures 66a disposed on both sides of the longitudinal extent thereof. Since both the upper cathode shield 68 and lower cathode shield 66b are elongated members which extend across the full transverse extent of the deposition chamber and are coextensive with the transverse extent of the web of substrate material 11 and the cathode plate 62, the precursor gaseous mixture introduced into the plasma regions is substantially confined within those regions.

It is to be noted at this point that the precursor gaseous mixture introduced through the apertured introductory manifold 64 is adapted to assume a generally vertical path of travel as depicted by arrow A, said path of travel being generally parallel to the path of movement of the web of substrate material through the plasma region. A plurality of banks of substrate heaters 72a, including heat reflecting shields 72, are operatively disposed on either side of the web of substrate material 11 so as to maintain the temperature thereof at the preselected deposition temperature. A plurality of elongated ceramic magnets 74 are also operatively disposed along the path of travel of the web of substrate material 11 so as to urge said web of substrate material 11 into a generally planar configuration as said web moves through the plasma region and has semiconductor alloy material deposited thereupon. A power source 70 which, in the preferred embodiment is a source of r.f. electromagnetic energy, is operatively coupled to the cathode plate 62 for generating an electromagnetic field between both faces of that cathode plate 62 and the conductive web of substrate material 11 passing therepast. In this manner, the precursor gaseous mixture flowing through the space developed between both faces of the cathode plate 62 and the web of substrate material 11 is subjected to an electromagnetic field and decomposed into a highly energetic plasma from which a preselected layer of semiconductor alloy material is continuously deposited upon the moving web of substrate material 11.

It should therefore be apparent that the web of substrate material 11 is adpated to enter the deposition chambers 40 and 42 and move about a first turning roller 76a which rotatably engages a support 76. After passing about the first roller 76a, said web 11 assumes a generally vertical and upwardly directed path of travel past the plasma region created on the left-hand side of the cathode plate 62 so that semiconductor alloy material from the plasma region can be continuously deposited thereupon. At the upper end of the deposition chambers 40 and 42, a second turning roller 76b, also rotatably engaging a support 76, changes the direction of movement of the web of substrate material 11 from a vertical and upward direction to a downward and vertical direction through the plasma region developed on the right-hand face of the cathode plate 62 so that semiconductor alloy material from said right-hand region is continuously deposited thereupon. Finally, a third turning roller 76c, which is in rotatable engagement with support 76, is adapted to change the direction of travel of the web of substrate material 11 from its downward and generally vertical direction to the exit orientation it must assume as it departs from the deposition chambers 40 and 42. Note that the circumferential periphery of the second turning roller 76b is in surface-to-surface contact with the deposition surface of the web of substrate material 11. However, the central portion of said roller 76b is recessed so that only the longitudinal edges of the web 11 are in contact with the circumferential periphery of the roller 76b and the semiconductor alloy material deposited thereupon is not scratched or otherewise marred by frictional contact with the roller (the longitudinal edges of the web 11 are subject to the deposition thereonto of poorer quality semiconductor alloy material than is deposited onto the central portion due to "edge effects" and the edges are therefore removed from the photovoltaic devices prior to modularization thereof).

III. The Circular Isolation Passageway

From the foregoing description of the multichamber processor, it can be seen that by utilizing the non-linear path of travel principles of Applicants' assignee's previously filed application, the total length of the processor 26 has been substantially foreshortened. The result is the more efficient, more economical manufacture of photovoltaic devices. However, as should also be apparent from the foregoing description of the processor, as well as a perusal of FIG. 2, the gas gates 46a–46b for a substantial proportional of the total length of that processor. Accordingly, the operative disposition of the improved, non-linear isolation passageway of the present invention, when taken in combination with the nonlinearity of the aforedescribed processor, will not only serve to still further shorten the overall length thereof, but will also further improve the degree of isolation between adjacent environments.

It must be borne in mind, before proceeding with a detailed description of the improved isolation passageway of the subject invention, that the primary purpose of such a passageway remains the prevention of diffusion of dopant contaminants from the dopant depositon chamber into the intrinsic deposition chamber operatively connected thereto. To this end, all of the "tricks" previously described in the aforementioned patent applications of Applicants' assignee are also available for use with the subject isolation passageway. For instance, the p dopant deposition chamber and n dopant deposition chambers may be maintained at lower internal pressure than the intrinsic deposition chamber by providing each deposition chamber with automatic throttle valves, pumps and manometers. In this manner the pressure within the dopant deposition chambers may be maintained at, for instance, approximately 0.55 Torr and the pressure within the intrinsic deposition chamber may be maintained at for example, approximately 0.6 Torr. Hence a pressure differential is established and maintained between the dopant deposition chambers and the intrinsic deposition chamber to provide for substantially unidirectional gas flow of non-contaminating intrinsic gases through the isolation passageway.

Figure 3:
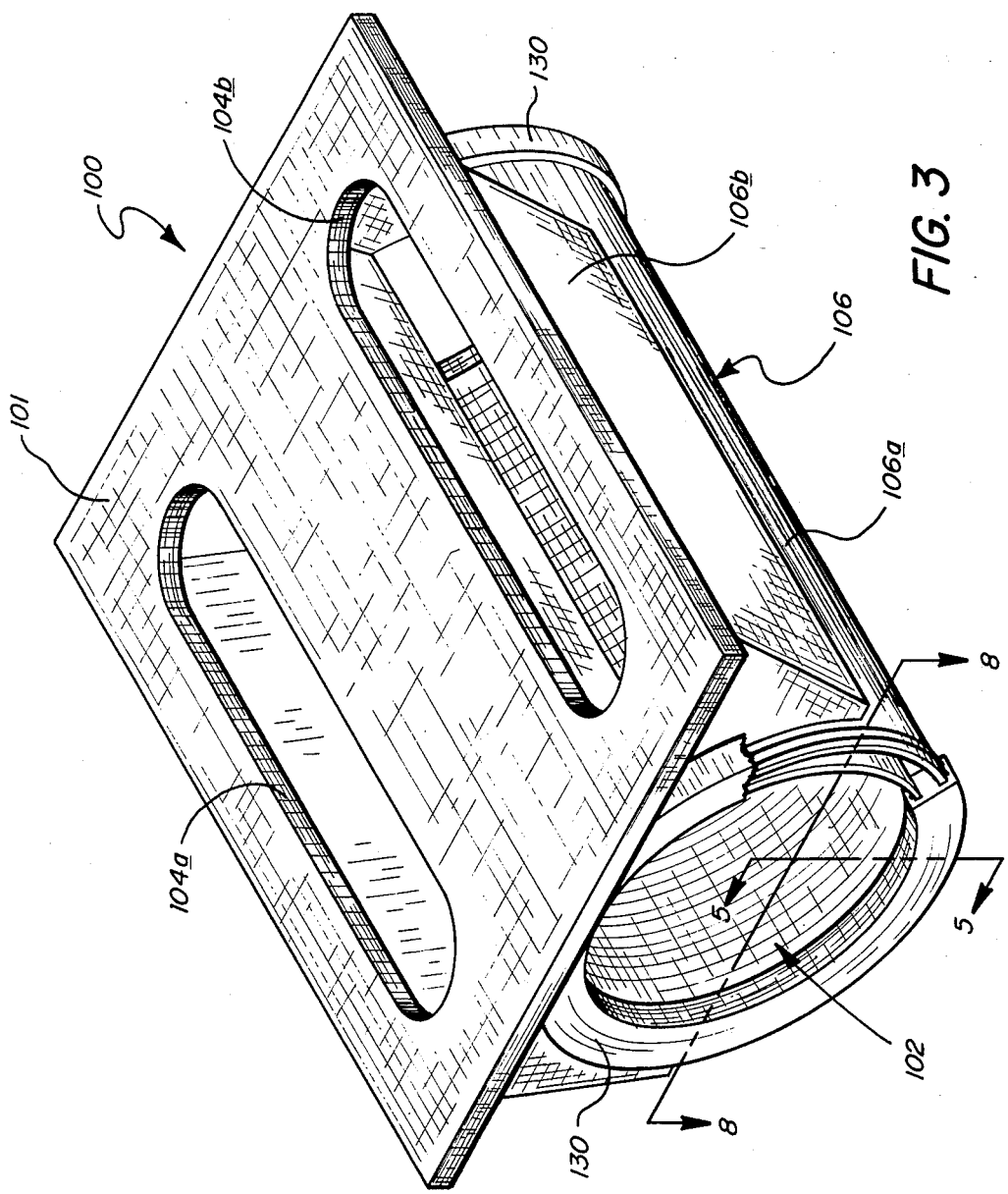
FIG. 3 is a perspective view of the improved circularly-shaped isolation passageway of the instant invention, said passageway particularly adapted for operative deployment in the apparatus of FIG. 2.

Turning now to FIG. 3, the isolation passageway of the instant invention is illustrated generally by the reference numeral 100. It is to be noted that the isolation passageway 100 is formed with an inner, generally elongated, cylindrically-shaped drum 102. The length of the drum 102 is dependent upon the width of the web of substrate material 11 which is adapted to pass therethrough between one of the deposition chambers such as the $n_3$ deposition chamber 40 and the intrinsic deposition chamber 42, i.e., the length of the drum 102 must be at least equal to the width of the web 11. The isolation passageway 100 further includes a top plate 101 which has a pair of elongated slots 104a and 104b spacedly formed therethrough, the length of the slots approximating the width of the web of substrate material 11 which is adapted to pass therethrough. More particularly, the web of substrate material 11 enters the isolation passageway 100 through the introductory slot 104a and exits the passageway 100 through exit slot 104b. The top plate 101 is generally planar in configuration and, in the preferred embodiment, is adapted to be secured to the undersurface of each of the adjacent deposition chambers 40 and 42. Because of the manner in which it may be secured in overlapping relationship below the adjacent deposition chambers, the isolation passageway 100 is further adapted to foreshorten the total length of the processor 26. Note that as best seen in FIG. 4, the passageway 100 is generally annular in a central region and generally rectangular in the regions adjacent to the central region.

It is further to be noticed, and as best illustrated in FIG. 4, that the web of substrate material 11 may be brought into the deposition chambers or may exit from the deposition chamber at an angle with respect to the turning rollers 76a and 76c because of the tangential manner in which the web of substrate material 11 is wrapped about a portion of the circumference of both the turning rollers 76a and 76c and the circularly shaped drum 102. It is to be noted herewith that total length of the passageway opening 100 which a molecule of contaminating reaction gas must pass in order to traverse the distance from one of the adjacent deposition chambers to the other of the chambers is the same as the distance through the passageway which must be traversed in the planar FIG. 2 embodiment of the gas gates, however, that distance is now formed so as to be at least partially circular so that while the total linear distance is identical to molecules of gaseous contaminants, the horizontal length of the gas gate is greatly shortened, there correspondingly shortening the total overall length of the semiconductor deposition processor 26.

Returning now to the stuctural configuration of the circular isolation passageway 100, the planar top plate 101 is secured by a radially outermost, circumferentially extending enclosure panel 106, the radial difference between said panel 106 and the drum 102 serving to define the dimension of the lowermost substrate-contacting passageway opening 105. More particularly, the panel 106 includes a generally circularly shaped lower portion 106a which is joined by side portions 106b to the top plate 101. The generally circular bottom portion 106a has a radius greater than the radius of the cylindrical drum 102, but is concentrically formed therewith. In a like manner, a top circumferential portion defines an upper non-substrate contacting passageway 107.

The web of substrate material is held tightly against the bottom peripheral surface of the cylindrical drum 102 by tension developed by the turning rollers 76a and 76c operatively disposed in the bottom part of each of the deposition chambers 40 and 42, respectively. Since the isolation passageway 100 interconnects these two adjacent deposition chambers, contaminating reaction gases may pass between the deposition chambers through either (1) the upper non-substrate contacting passageway 107 defined between the upper circumferential portion 108 of the plate 101 and the upper circumferential surface of the drum 102 or (2) the lowermost substrate-contacting passageway 105 defined between the inner circumferential surface 106a of the encapsulating plate 106 and the lower circumferential surface of the drum 102. Since the likelihood of contamination exists, some mechanism is necessary in order to prevent diffusion of contaminating molecules of reaction gases between the adjacent, operatively interconnected deposition chambers. One such solution has been mentioned hereinabove and resides in the ability to maintain the dopant deposition chambers at a different partial pressure than the partial pressure present in the intrinsic deposition chamber. In this manner, it is possible to limit the flow of gaseous reactants through the gas gate passageway to the intrinsic gaseous reactants introduced into the intrinsic deposition chambers. These intrinsic deposition gases are moved through the passageway at a sufficient velocity to collide with any diffusing dopant gas molecules and thereby prevent the diffusion of the dopant molecules into the intrinsic deposition chamber.

Figure 7:
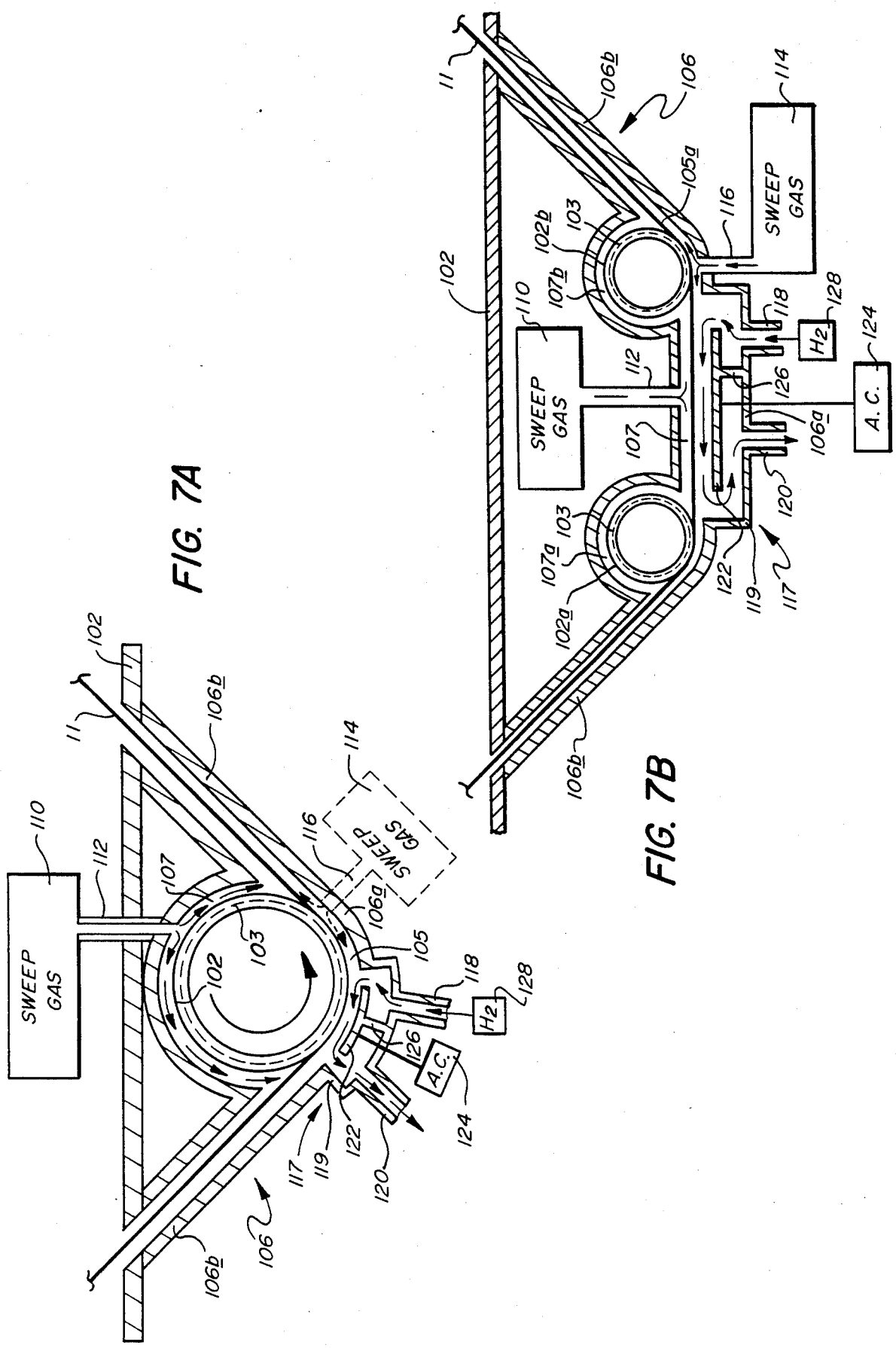
FIG. 7A is a partial cross-sectional view similar to FIG. 6 and illustrating the operative disposition of a source of alternating current, relative to the isolation passageway of the instant invention, said source adapted to generate a hydrogen plasma over the layered surface of the substrate.
FIG. 7B is a partial cross-sectional view similar to FIG. 7A and illustrating the operative disposition of said alternating current source relative to another preferred embodiment of the isolation passageway of the instant invention, said alternating current source disposed between a pair of spaced rotary drums.

However, in view of the high degree of purity which must be maintained between the adjacent deposition chambers, it may be necessary to still further limit the diffusion of contaminating gas molecules. In view of this concern toward the maintenance of ultra-high purity deposition environments, it becomes necessary to further inhibit gas diffusion by providing for a sweep of an inert gas into either or both (1) the upper non-substrate contacting passageway 107 and/or (2) the lowermost substrate-contacting passageway 105 developed in the circular isolation passageway 102 of the subject invention. This can be best seen in FIG. 7 wherein sweep gas is introduced into both the upper and lower isolation passageways. More specifically, a source of sweep gas 110 is provided to introduce sweep gas through an introductory conduit 112 into the upper, generally circular passageway 107 which separates two adjacent deposition chambers (such as 40 and 42 of FIG. 4). Similarly, a source of sweep gas 114 is adapted to supply an inert gas such as hydrogen or argon into the lowermost circular passageway 105 through an introductory conduit 116. It is to be noted that the lowermost passageway 105 is defined to exist between the coated surface of the web of substrate material 11 and the generally circularly-shaped lower portion 106a of the encapsulating plate 106.

As illustrated in FIG. 7A, the sweep gas source 114 and introductory conduit 116 which are adapted to introduce the inert gas into the lower passageway 105 are shown in phantom outline. This is because of the presence in that figure of a hydrogen plasma developing chamber generally 117, which may be included as another preferred embodiment of the isolation passageway 100 of the subject invention. The hydrogen plasma chamber 117 is formed by a generally bulbous shaped extension 119 of the lower circumferentially extending portion 106a of the encapsulating plate 106, the extension including a hydrogen gas introductory duct 118 and a spent gas exit duct 120. A cathode plate 122 (curved in the FIG. 7A embodiment) is operatively disposed in proximate relationship to the correspondingly configured and layered surface of the web of substrate material 11, as that web passes through the lowermost isolation passageway 105. The cathode plate 122 is preferably shaped in a generally circular configuration so as to be at all points equidistant from the contiguous surface of the web of substrate material 11 which has assumed the contour of the cylindrical drum 102 against which it is tightly pressed. The cathode plate 122 is connected to a source of electromagnetic energy 124, such as alternating current microwave energy or radio energy frequencies. It is to be appreciated that if microwave energy is to be used, instead of employing a cathode plate for decomposing the hydrogen gas and thereby depositing a hydrogenated cap atop the amorphous silicon layered surface of the web of substrate material 11 passing therepast, a microwave antenna could be employed. Also, although alternating current represents the preferred embodiment of electromagnetic energy, a DC power source could also be employed to decompose the hydrogen gas. As is well known to those skilled in the art, the distance from the cathode plate 122 to the substrate 11 must be greater than the dark space distance for the particular operating conditions employed if a plasma is to be generated and sustained therein.

A cathode shield 126 divides the bulbous compartment 119 into two portions so that the introduced hydrogen gas from source 128 must, of necessity, flow around the bottom edge of the cathode plate 122 into the lowermost passageway 105. It is in this passageway 105 that said hydrogen gas is decomposed and the decomposed species are deposited upon the exposed surface of the web of substrate material 11 before leaving the passageway 105 through the exit duct 120. The incorporation of the bulbous extension 117 into the passageway assembly 100 serves two functions. In the first place, said extension 117 is specifically adapted to provide for the hydrogen capping of the previously deposited layer of semiconductor alloy material, a cap which has been shown important to achieve the highest possible photovoltaic conversion efficiencies from the solar cells fabricated in the processor 26. The second function which the hydrogen plasma developed in the bulbous extension 117 serves is to prevent any further diffusion of process gases from one of the deposition chambers into the adjacent deposition chamber. This diffusion prevention mechanism occurs because contaminating gases flowing past the cathode 120 must be decomposed and deposited upon the web of substrate material 11 along with the hydrogenated species. It is for this reason that the FIG. 7A sweep gas source 114 and conduit 116 are illustrated in phantom, i.e., because the sweep gas is not an essential element of diffusion prevention if the lower passageway 105 is equipped with hydrogen plasma capabilities. It is also to be noted that the reason the bulbous extension 117 has not been illustrated in the FIG. 4 embodiment or in the FIG. 2 embodiment of the processor 26 is because of space limitations only. The use of a hydrogen plasma is considered an important feature and when employed to cap at least the layer of intrinsic semiconductor alloy material (after the web of substrate material 11 exits from the intrinsic deposition chamber), said plasma represents the best mode of operation of the processor.

Turning now to FIG. 5, a cross sectional view of the inner cylindrical drum 102 of the isolation passageway 100 of the instant invention is employed so as to best illustrate the grooved circumferential surface thereof. More particularly, the cylindrical drum 102 includes a circumferential surface 120 against a portion of which the web of substrate material 11 is continuously urged into contact. The length of the circumferential surface 120 must be at least as wide as the width of the web of substrate material 11 passing thereagainst so that the entire width of the web 11 contacts a grooved portion of that circumferential surface 120. Although not shown, a drive system may be employed to provide for the rotation of the cylindrically shaped drum 102 so that rotation of the drum 102 can be used to provide tension on the web of substrate material 11 intermediate of the web drive assemblies which were heretofore present only adjacent the pay-off and take-up chambers of the processor 26. Because of the tight tension which may now be placed on the web of substrate material 11, warpage and canoeing of the web 11 (which, although reduced in prior art gas gates of Applicants' design, was still present therein) is almost totally eliminated thereby enabling the total height of the passageway opening 105 to be reduced thereby decreasing the possible diffusion of gases from one of the dopant deposition chambers to the adjacent intrinsic deposition chamber. Through the use of the concepts espoused by the present invention, the height of the isolation passageway opening has been decreased in such a manner that a corresponding decrease in back diffusion, by a factor of approximately two orders of magnitude, has been achieved.

As best seen in FIG. 6 the inner surface 106a of the encapsulating wall 106 of the isolation passageway 100 forms the bottom surface of the lowermost passageway opening 105 connecting deposition chambers 40 and 42. It is between this surface 106a and the layered surface of the web of substrate material 11 that a minimum tolerance must be maintained so as to provide for the passage of the web 11 therethrough while, at the same time, preventing any rubbing or scraping of the deposited layers of semiconductor alloy material thereagainst. As previously explained, despite the relatively small size of the opening 105, sweep gas from the source 114 must be introduced into the lower opening 105 through nozzle 116 so as to inhibit the back diffusion of process gases from a dopant deposition chamber into the adjacent and operatively interconnected intrinsic deposition chamber. However, the relatively narrow upper slit defined between the cylindrical drum 102 and the unlayered surface of the web of substrate material 11 may be sufficiently narrow that the viscous sweep gases are unable to attain sufficient velocity to prevent back diffusion of dopant gases from the dopant chambers into the intrinsic deposition chamber.

In order for the inherently viscous inert gases to be swept through the relatively narrow upper passageway formed between the web of substrate material 11 and the outer surface of the elongated drum 102 with sufficient velocity to substantially prevent the back diffusion of process gases from the dopant chambers into the intrinsic chamber, the outer circumferential portion of the drum 102 is formed with a plurality of circumferentially extending generally parallel grooves, some of which are illustrated and represented by the number 103. The grooves 103 extend about the entire circumferential extent of the drum 102 so as to be able to operatively communicate at one end with a dopant deposition chamber and at the other end with the adjacent intrinsic deposition chamber. It is in this manner that sweep gases may be passed through the flow channels defined by the grooves 103 to prevent diffusion of gaseous contaminants between said adjacent chambers. Each of the substantially parallel grooves 103 is defined by opposed side walls 103a and an innermost wall 103b. The unlayered surface of the web of substrate material 11 is urged against the upper surface 120 of the elongated cylindrical drum 102. The side walls 103a extend downwardly approximately $\frac{1}{8}$ inch and are separated by the innermost wall 103b which is about $\frac{1}{4}$ inch wide, thereby providing a plurality of $\frac{1}{8}$ inch high and $\frac{1}{4}$ inch wide flow channels between the web 11 and the upper surface 120 of the drum 102, thereby interconnecting adjacent deposition chambers. Because of the increased size of the flow channels as compared to the size of the passageway which would otherwise exist between the unlayered surface of the web of substrate material 11 and the exposed surface 120 of the elongated drum 102, the velocity of gases swept therethrough is substantially increased to a value which is effective in minimizing the back diffusion of process gases.

It should be appreciated that the molecules of gases flowing through the upper passageway opening 105 may either travel through the flow channels defined by the grooves 103 or through the relatively narrow space which exists between adjacent grooves 103. In either event the inert gases which is caused to flow through the grooves 103 are able to attain sufficient velocity to substantially prevent back diffusion of process gases. This is true despite the fact that the inert gases flowing through the relatively narrow space between adjacent grooves are not able to attain sufficient velocity to prevent diffusion. However, due to the length of the path which the dopant process gases must traverse in order to back diffuse into the intrinsic deposition chamber, the probability is remote that said gases will be able to complete the journey to the intrinsic deposition chamber without entering the high velocity flow channel grooves 103. Once the gas molecules enter the high velocity grooves 103, those dopant process gases will move with the swift and counter-directed flow of the sweep gases and be returned to the dopant chamber. In this manner, contamination of the intrinsic chamber caused by dopant process gases diffusing through the upper, relatively narrow passageway opening 105 may be substantially reduced.

While the grooves 103, when taken in combination with the introduction of sweep gas adjacent the intrinsic deposition chamber side of the isolation passageway 100 serves to substantially reduce diffusion problems, it has been determined that the introduction of additional sweep gas directly into each of the grooves 103 approximate th midway point between the adjacent deposition chambers seems to provide an additional reduction in the back diffusion of contaminating process gases. The inert sweep gas introduction system, which will be described in the following paragraph, has been found to offer excellent results in increasing the rate of flow of sweep gas through the relatively narrow upper passageway opening 105, consequently reducing diffusion.

More particularly, argon, hydrogen or another substantially inert gas is adapted to flow into a sweep gas supply manifold, generally 122, via feed line 124 from a sweep gas source 126. The inert gas is then fed from the manifold 122, at a flow rate of at least 50 SCCM through each of the feed conduits 128 directly into each of the flow channel grooves 103. Since the sweep gas is introduced into the grooves 103 at a pressure of about 1.0 Torr, the pressure at both of the deposition chambers are sensed to be substantially identical (actually a higher pressure is maintained in the intrinsic deposition chamber to obtain a substantially unidirectional flow of process gases toward the dopant deposition chamber)

and the inert gas flows in substantially equal volumes per unit time toward both of the adjacent chambers.

However, it should be noted that the length of the passageway must be increased when such an intermediate sweep gas introduction mechanism is employed. This is because it is desirable that the total length which the process gases must travel in order to be substantially prevented from any back diffusing is about 8 inches (from the point of inert ga introduction). Should the dopant process gases reach the intermediate introduction point, the dopant gases would likely be caught in the flow of the incoming sweep gas and swept therealong toward the intrinsic deposition chamber. The only significant restriction as to the intermediate sweep gas introduction system is that the cross sectional area of the feed conduits 128 should be small relative to the size of the groove into which they supply the inert sweep gas. This is because the web of substrate material 11 may occasionally not be maintained in a perfectly planar configuration and the dimension of the upper passageway opening is likely to vary with the linearity of the web. Therefore, in order to introduce substantially equal volumes of gas per unit time into each of the grooves 103, despite fluctuating groove capacities and corresponding pressures (due to fluctuating web linearity) it is necessary that the cross-sectional area of the feed conduits 128 be small relative to the size of the flow channels formed by the grooves 103.

Referring now to FIG. 7B, a partial cross-sectional view of FIG. 7A is illustrated. FIG. 7B shows the operative position of a hydrogen capping assembly relative to yet another preferred embodiment of the isolation passageway 100 of the instant invention, said assembly including a pair of spaced rotary drums 102a and 102a. The FIG. 7B embodiment is to be utilized in cases wherein it is necessary to achieve the highest degree of isolation between adjacent passageways and particularly in those instances wherein it is not desired to allow for any chance of contaminants from one of the pair of adjacent deposition chambers to be deposited in the hydrogen capping plasma. More particularly, a sweep gas 114 and an introductory conduit 116 are adapted to introduce an inert gas into the lower passageway 105a. In this embodiment, the dopant deposition chamber is disposed on the right hand side so that the web of substrate material 11 is entering thereinto. Therefore the sweep gas source 114 is adapted to prevent the dopant constituents from entering the hydrogen plasma assembly in which it would be deposited along with the hydrogen to cap the deposited layer of semiconductor alloy material which is of an intrinsic nature. The hydrogen plasma assembly 117 is formed by a generally bulbous shaped extension 119 of the lower circumferentially extending portion 106a of the encapsulating plate 106, the extension including a hydrogen gas introductory duct 118 and a spent gas exit duct 120. A cathode plate 122 is operatively disposed in proximate relationship to the correspondingly configured and layered surface of the web of substrate material 11 as that web passes through the space between contiguous cylindrically shaped drums 102a and 102b. The cathode plate 122 is connected to a source of electromagnetic energy 124 such as alternating current microwave energy or radio energy frequencies. Again, a microwave antenna may be employed if the microwave energies are used and the systems from the cathode plate 122 to the web of substrate material 11 must be greater than the dark space distance for the particular operating conditions employed if a plasma is to be generated and sustained.

A cathode shield 126 divides the bulbous compartment 119 into two portions so that the introduced hydrogen gas from the source 128 must, of necessity, flow around the bottom edge of the cathode plate 122 into the lowermost passageway 105. It is in this passageway 105 that the hydrogen gas is decomposed and the decomposed species are deposited upon the exposed surface of the web of substrate material 11 before leaving the passageway 105 to the exit duct 120. Unlike the embodiment illustrated in FIG. 7A, the sweep gas source 114 and the conduit 116 are illustrated in solid lines because the sweep gas is an essential element of the diffusion prevention even though the passageway 105 is equipped with hydrogen plasma capabilities. It is further to be noted that sweep gas from the source 110 and the conduit 112 enter into the upper passageway 107 and prevent gaseous contaminants from diffusing into the adjacent upper passageways 107a and 107b of the rollers 102a and 102b, respectively. It should therefore be apparent that the FIG. 7B embodiment provides the most contaminant free embodiment of the isolation passageway 100 of the subject invention.

It should therefore be understood, and as best seen in FIG. 6, that the isolation passageway 100 of the instant invention, will, in a preferred embodiment, include three sources of sweep gas introduced into each discrete one of the passageway openings. More particularly, the first source of sweep gas 114 is adapted to introduce an inert gas via nozzle 116 between the enclosure wall 106a and the layered surface of the web of substrate material 11; the second sweep gas introductory source 110 is adapted to introduce sweep gas via nozzle 112 into the passageway opening 107 which exists at the upper portion of the cylindrical drum 102, i.e., the portion about which the web of substrate material 11 is not in contact; and the third source of sweep gas 122 which is adapted to introduce sweep gas via nozzle 124 (shown in FIG. 5), manifold 122 and conduits 128 into the flow channels 103 (shown in FIG. 5) so as to prevent diffusion between the unlayered surface of the web of substrate material 11 and the surface 120 of the elongated cylindrically shaped drum 102.

Therefore, from the illustration of FIG. 6, it can be seen that sweep gas is preferably introduced into three areas of the isolation passageway assembly 100 so as to substantially prevent the diffusion of process gases between adjacent deposition environments. Of course, in the embodiment of the subject invention wherein a hydrogen plasma is employed, one of the sweep gas flows may be eliminated. Specifically, sweep gases are introduced at the upper, generally circularly shaped portion of the passageway 107 which is defined between the upper encapsulating wall 109 and the upper surface of the cylindrically shaped drum 102 from sweep gas introductory tank 110 via introductory nozzle 112. Similarly, sweep gas is introduced from sweep gas manifold 114 via nozzle 116 into that portion of the isolation passageway which is defined between the layered surface of the web of substrate material 11 and the cylindrically shaped lower wall 106a of the encapsulating wall 106. Finally, sweep gas is introduced from a manifold 122 via nozzle 128 into the grooves 103 so as to move through the flow channels within each of the grooves 103 so as to prevent diffusion in the passageway formed between the web of substrate material 11 and the surface of the drum 120. While the three distinct sources of sweep gas represent a preferred embodiment of the instant invention, note that the use of this plurality of sources is dependent upon the degree of isolation between adjacent environments which is required. It is only necessary to provide all three of the sources of sweep gas if an ultrapure environment is required; however, for environments wherein the minimum $10^4$ ratio of contamination is acceptable, a lesser number of these sources may suffice.

Figure 8:
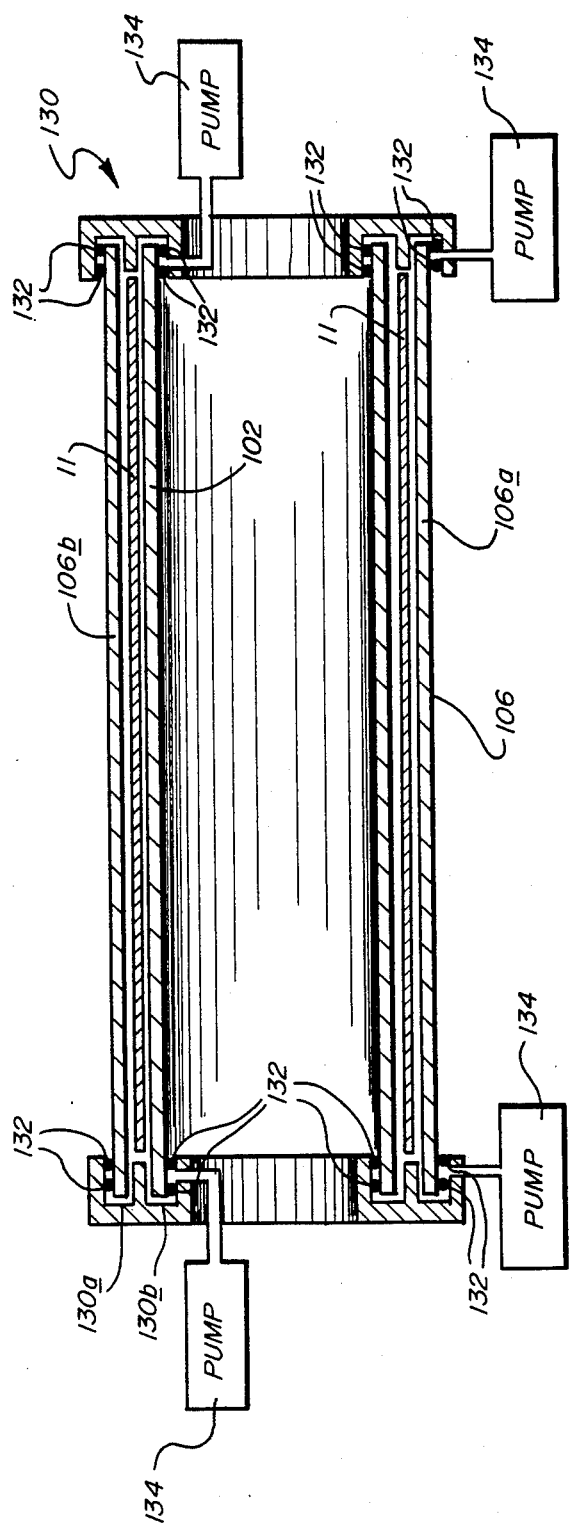
FIG. 8 is a partial cross-sectional view taken along line 8—8 of FIG. 3 and illustrating the operative disposition of a vacuum-tight end seal for preventing leakage between the interior of the isolation passageway of the subject invention and atmosphere.

Finally, it is still essential that a leak-tight seal be provided between the environment and the edge portions of the isolation passageway assembly 100. To that end, specially designed end plates 130, see FIG. 8, have been developed for use with said isolation passageway. Each of the end seals 130 is generally annularly shaped with a substantially E-shaped cross sectional configuration. Note that in the interest of simplicity, the various sweep gas manifolds as well as the grooved nature of the elongated cylindrically shaped drum 102 have not been illustrated in FIG. 8. The sole purpose of this figure is to depict the leak-proof nature of the end seals 130. To this end, the radially outermost bite portion 130a of the E-shaped outer end seal 130 is adapted to receive thereinto the encapsulating wall 106, while the radially innermost bite portion 130b of the E-shaped seal 130 is adapted to receive thereinto a peripheral edge of the elongated cylindrically shaped drum 102. Both the radially innermost wall of the innermost bite shaped portion 130b and the radially outermost portion of the outermost bite 130a are indented to receive a pair of spaced O-rings 132. Pumps 134 are operatively disposed and adapted to evacuate any diffusing gases from the space between each of the pair of O-rings 132 in both the upper and lower bite portions of the E-shaped seals so as to prevent the introduction of contaminants from the atmosphere into the vacuumized isolation passageway 100.

It should thus be apparent, based upon the foregoing description, that the isolation passageway of the subject invention has not only improved the diffusion barrier of prior gas gates, but has accomplished that improvement while foreshortening the overall length of the deposition apparatus. Therefore, benefits are derived from the subject invention in terms of improved photovoltaic devices, lower capital expenditures and reduced operational difficulties.

It should be understood that the present invention is not limited to the precise structure of the illustrated embodiment. It is intended that the foregoing description of the presently preferred embodiments be regarded as an illustration rather than as a limitation of the present invention. It is the claims which follow, including all equivalents, which are intended to define the scope of this invention.

We claim:

1. An isolation passageway for substantially preventing the diffusion of gases from the first of a pair of adjacent vacuumized environments into the second of said pair of vacuumized environments, said first environment differing from the second by the presence of at least one element:
   said passageway:
   (1) defined by closely spaced walls;
   (2) adapted to provide for the movement of a substrate therethrough along a path interconnecting said environments;
   (3) being substantially annular in a cross-section of a central region of said passageway, said cross-section taken in a plane extending in the direction of said path; one boundary of the annular region being formed by a cylindrical drum;
   (4) adapted to maintain at least a $10^4$ ratio of the concentration of said at least one element in said first environment as compared to the concentration thereof in said second environment;
   (5) including means for urging one surface of the substrate traveling through the passageway into contact with the circumferential surface of said drum; and
   (6) the circumferential surface of said drum having a plurality of circumferential grooves spacedly positioned across the longitudinal extent thereof.

2. A passageway as in claim 1, wherein the circumferential surface of said drum which contacts the surface of the substrate is fabricated from a low friction, low thermal conductivity material.

3. A passageway as in claim 2, wherein said circumferential surface of said drum is formd of borosilicate glass.

4. A passageway as in claim 3, wherein the substrate is formed from a magnetic material and the substrate is urged into contact with the glass by magnetic attraction.

5. A passageway as in claim 1, wherein each of the adjacent environments is developed and maintained in a dedicated chamber, each chamber adapted to deposit thim film layers of semiconductor alloy material onto the substrate.

6. A passageway as in claim 1, further including means for vacuumizing the environments to a pressure of about 0.25 to 1 torr.

7. A passageway as in claim 1, further including roller means for urging the substrate into contact with said circumferential surface.

8. A passageway as in claim 1, further including means for introducing sweep gas into a first flow channel formed between the grooves and the substrate.

9. A passageway as in claim 8, wherein the introducing means is adapted to initiate and sustain a flow of sweep gas at a velocity sufficient to substantially prevent the diffusion of process gas from the first environment to the second environment through said first channel.

10. A passageway as in claim 9, wherein the introducing means comprises a source of relatively inert gas and an introductory manifold; and said first channel includes aperture means for receiving sweep gas from said introductory manifold.

11. A passageway as in claim 8, further including means for introducing sweep gas into a second flow channel formed between the substrate and the surface of the passageway opposite said circumferential surface.

12. A passageway as in claim 11, wherein the introducing means is adapted to initiate and sustain a flow of sweep gas through the second channel of the passageway at a velocity sufficient to substantially prevent the diffusion of process gas from the first to the second environment through said second channel.

13. A passageway as in claim 12, wherein the introducing means comprises a source of relatively inert gas and an introductory manifold; and said second channel includes aperture means for receiving sweep gas from said introductory manifold.

14. A passageway as in claim 1, further including means for subjecting the surface of the substrate not urged into contact with said circumferential surface to a plasma as said substrate moves through said passageway.

15. A passageway as in claim 14, wherein the first environment is a first chamber adapted for the deposition of a first layer of semiconductor alloy material and the second environment is a second chamber adapted for the deposition of a second layer of semiconductor alloy material.

16. A passageway as in claim 15, wherein the subjecting means is adapted to develop and sustain a hydrogen plasma for capping the surface of the previously deposited layer of semiconductor alloy material.

17. A passageway as in claim 16, wherein the subjecting means includes a cathode operatively coupled to an r.f. power supply for developing said plasma.

18. A passageway as in claim 16, wherein the subjecting means includes an antenna operatively coupled to a source of microwave energy for developing said plasma.

19. A passageway as in claim 1, wherein the ends of the cylindrical drum are leak-proofed by an annularly-shaped end seal.

20. A passageway as in claim 19, wherein each of the end seals include a pair of spaced O-rings.

21. A passageway as in claim 20, wherein a pump is provided to evacuate the space between each of the O-rings.

* * * * *